United States Patent
Lee et al.

(10) Patent No.: US 10,564,746 B2
(45) Date of Patent: Feb. 18, 2020

(54) DISPLAY DEVICE AND METHOD OF MANUFACTURING THE SAME

(71) Applicant: Samsung Display Co., Ltd., Yongin-si, Gyeonggi-do (KR)

(72) Inventors: Ung Soo Lee, Yongin-si (KR); Jin Woo Park, Yongin-si (KR); Ho Youn Kim, Yongin-si (KR); Hyun Chul Oh, Yongin-si (KR); Jun Young Lee, Yongin-si (KR); Hyun Soo Jung, Yongin-si (KR); Su Hyuk Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 270 days.

(21) Appl. No.: 15/404,039

(22) Filed: Jan. 11, 2017

(65) Prior Publication Data
US 2017/0199609 A1    Jul. 13, 2017

(30) Foreign Application Priority Data
Jan. 12, 2016 (KR) .................. 10-2016-0003790

(51) Int. Cl.
*G06F 3/041* (2006.01)
*G06F 3/044* (2006.01)

(52) U.S. Cl.
CPC ............ *G06F 3/0412* (2013.01); *G06F 3/044* (2013.01); *G06F 3/0416* (2013.01); *G06F 2203/04103* (2013.01); *G06F 2203/04111* (2013.01)

(58) Field of Classification Search
CPC ...... G06F 3/0412; G06F 3/0416; G06F 3/044; G06F 2203/04103; G06F 2203/04111; H01L 27/323; H01L 27/326
See application file for complete search history.

(56) References Cited

U.S. PATENT DOCUMENTS 8,330,339 B2    12/2012    Oh et al.
8,872,168 B2    10/2014    Choi et al.
(Continued)

FOREIGN PATENT DOCUMENTS

EP    2 722 737 A1    4/2014
KR    10-1056260 B1    8/2011
(Continued)

OTHER PUBLICATIONS

Extended European Search Report dated May 29, 2017 for European Patent Application No. EP 17 151 230.4, which shares priority of Korean Patent Application KR 10-2016-0003790 with subject U.S. Appl. No. 15/404,039.

(Continued)

*Primary Examiner* — Stacy Khoo
(74) *Attorney, Agent, or Firm* — Lewis Roca Rothgerber Christie LLP

(57) ABSTRACT

A display device and a method of manufacturing a display device are disclosed. In one aspect, the display devices includes display area configured to display an image, a non-display area adjacent to the display area, and a first substrate having a first side and including a touch sensor in the display area and a touch sensor pad in the non-display area. The display device also includes a second substrate opposite to the first substrate, the second substrate including a pixel in the display area and a connecting pad in the non-display area, and a conductive member configured to electrically connect the touch sensor pad and the connecting pad. An inter-bar is interposed between the first and second substrates and between the first side of the first substrate and the touch sensor pad.

48 Claims, 18 Drawing Sheets

(56) References Cited

U.S. PATENT DOCUMENTS

| | | | |
|---|---|---|---|
| 9,076,985 B2 | 7/2015 | Sakamoto et al. | |
| 9,184,409 B2 | 11/2015 | Choi et al. | |
| 2003/0201155 A1 | 10/2003 | Katakami | |
| 2008/0211754 A1 | 9/2008 | Park et al. | |
| 2011/0147048 A1* | 6/2011 | Yamamoto | H05K 3/282 |
| | | | 174/126.1 |
| 2012/0105344 A1 | 5/2012 | Ko et al. | |
| 2013/0011969 A1* | 1/2013 | Chen | H01L 51/003 |
| | | | 438/111 |
| 2013/0093697 A1 | 4/2013 | Sun | |
| 2013/0270580 A1* | 10/2013 | Choi | H01L 51/524 |
| | | | 257/82 |
| 2013/0273315 A1 | 10/2013 | Mansky et al. | |
| 2014/0009400 A1* | 1/2014 | Poorter | G06F 3/041 |
| | | | 345/173 |
| 2014/0167010 A1* | 6/2014 | Jung | H01L 51/5246 |
| | | | 257/40 |
| 2014/0204285 A1* | 7/2014 | Jang | G06F 3/044 |
| | | | 349/12 |
| 2014/0306260 A1* | 10/2014 | Yamazaki | H01L 51/5012 |
| | | | 257/99 |
| 2015/0060806 A1 | 3/2015 | Park et al. | |
| 2015/0062101 A1 | 3/2015 | Kim et al. | |
| 2015/0208521 A1 | 7/2015 | Seo et al. | |
| 2015/0230361 A1* | 8/2015 | Lo | B32B 7/12 |
| | | | 174/520 |
| 2015/0234520 A1* | 8/2015 | Chen | G06F 3/044 |
| | | | 345/173 |
| 2015/0263300 A1* | 9/2015 | Namkung | H01L 51/0097 |
| | | | 257/40 |
| 2015/0372026 A1* | 12/2015 | Sato | H01L 27/1255 |
| | | | 257/71 |
| 2016/0147342 A1* | 5/2016 | Xiong | G06F 3/0412 |
| | | | 345/173 |
| 2016/0168788 A1 | 6/2016 | Choi et al. | |

FOREIGN PATENT DOCUMENTS

| | | |
|---|---|---|
| KR | 10-1178914 B1 | 8/2012 |
| KR | 10-2013-0039039 A | 4/2013 |
| KR | 10-2013-0115819 A | 10/2013 |
| KR | 10-1469486 B1 | 12/2014 |
| KR | 10-2015-0024471 A | 3/2015 |
| KR | 10-2015-0025994 A | 3/2015 |
| KR | 10-2015-0026429 A | 3/2015 |
| KR | 10-1599610 B1 | 2/2016 |

OTHER PUBLICATIONS

Extended European Search Report dated May 29, 2017 for European Patent Application No. EP 17 151 177.7, which shares priority of Korean Patent Application KR 10-2016-0003777 with U.S. Appl. No. 15/404,032, which is related to subject U.S. Appl. No. 15/404,039.

* cited by examiner

DISPLAY DEVICE AND METHOD OF MANUFACTURING THE SAME

CROSS-REFERENCE TO RELATED APPLICATION

This application claims priority to and the benefit of Korean Patent Application No. 10-2016-0003790, filed on Jan. 12, 2016, in the Korean Intellectual Property Office, the entire contents of which are incorporated herein by reference in their entirety.

This application relates to U.S. patent application entitled "DISPLAY DEVICE AND METHOD OF MANUFACTURING THE SAME," U.S. application Ser. No. 15/404,032, which is concurrently filed with this application and incorporated herein by reference in its entirety.

BACKGROUND

Field

The described technology generally relates to a display device and a method of manufacturing the same. In more detail, to a display device including a touch censor and a method manufacturing thereof.

Description of the Related Technology

A touch sensitive display device can sense a touch by a user and display an image.

Since the display device does not require a separate input device such as a keyboard or a mouse, the range of applications, particularly with mobile devices, is expanding.

Typically, the display device is produced by attaching a touch panel to a display panel after separately manufacturing each of these.

However, because the above method requires separate manufacturing processes for the touch panel and the display panel, it is inefficient with respect to manufacturing time and cost. Further, separate manufacturing of the touch panel and the display panel requires the step for integration.

SUMMARY OF CERTAIN INVENTIVE ASPECTS

One inventive aspect relates to a display device including a touch sensor with reduced defects.

Another aspect is a manufacturing method of a display device including a touch sensor with reduced the defects.

Another aspect is a display device including a display area displaying an image and a non-display area adjacent to the display area, the display device comprising: a first substrate including a touch sensor provided in the display area and a touch sensor pad part provided in the non-display area, a second substrate opposite to the first substrate and including a pixel provided in the display area and a connecting pad part provided in the non-display area, a conductive member connecting the touch sensor pad part and the connecting pad part, and an inter-bar provided between the first substrate and the second substrate, wherein the inter-bar is provided within a region from one side of the first substrate to the touch sensor pad part in a plan view.

In an embodiment, one side of the first substrate has a same shape or different shape from one side of the second substrate corresponding to one side of the first substrate. If the one side of the first substrate has a different shape, the one side of the first substrate can have a recess from the one side, in a plan view, and the inter-bar can extend along at least a portion of the one side of the first substrate.

In an embodiment, the first substrate has a rectangular shape in which the first to fourth sides are sequentially connected to one another, the one side of the first substrate is a first side, and the non-display area includes a pad area provided between the first side and the display area.

In an embodiment, at least a portion of the inter-bar can extend along an edge of the first side of the first substrate, and the inter-bar can be provided in an inseparable single body or in a plurality of portions.

In an embodiment, an interlayer can be provided in the display area between the first substrate and the second substrate. The interlayer has at least one side which is exposed to an outside, among the second to fourth sides.

In an embodiment, the inter-bar can have an end portion in an extension direction which meets the first and fourth sides of the first substrate.

An area of the second substrate can be larger than an area of the first substrate, in a plan view, the second substrate includes a non-overlapping portion not overlapping the first substrate, and a portion of the pad part is provided in the non-overlapping portion. A driving pad part can be provided in the non-overlapping portion of the second substrate. The inter-bar can be provided between the touch sensor pad part and the first side.

The connecting pad part can include a first connecting pad part and a second connecting pad part spaced apart from each other. The inter-bar can include a first inter-bar and a second inter-bar corresponding to the first and second connecting pad parts and spaced apart from each other, and a third inter-bar provided between the first and second inter-bars. The inter-bar can include a first inter-bar and a second inter-bar corresponding to the first and second connecting pad parts and spaced apart from each other, and a third inter-bar provided between the first and second inter-bars. A driving pad part can be provided between the first and second connecting pad parts. The third inter-bar can be provided between the display area and the driving pad part.

The conductive member can be integrally formed with at least a portion of the inter-bar in an inseparable body. At least the portion of the inter-bar can comprise conductive balls and an insulator surrounding the conductive balls. The inter-bar can include the conductive balls and the insulator in a region in which the inter-bar overlaps the touch sensor pad part, and the inter-bar include the insulator without the conductive balls in a region in which the inter-bar does not overlap the touch sensor pad part. The conductive member can extend in a lengthwise direction of the touch sensor pad part.

A length of the conductive member can be greater than a length of the touch sensor pad part in the lengthwise direction. In some embodiments, both end portions in the lengthwise direction of the conductive member do not overlap the touch sensor pad part.

The inter-bar can include spacers and a binder the spacers therein. The spacers can be a spherical shape, and a diameter of the spacers can be smaller than or same as a height of the inter-bar.

Another aspect is a manufacturing method of a display device including a display area and a non-display area, the manufacturing method comprising: forming a first substrate including a touch sensor in a display area and a touch sensor pad part in a non-display area, forming a second substrate including a pixel in the display device and a connecting pad part in the non-display area, pre-cutting a portion of the first substrate along a cutting line, forming a conductive member in the connecting pad part or in the touch sensor pad part, forming an inter-bar in at least one non-display area of the first substrate or the second substrate corresponding to the cutting line attaching the first substrate to the second substrate, and removing a pre-cut portion of the first substrate.

The cutting line can be provided in the non-display device and in a plan view, the cutting line is bent toward the display area.

The manufacturing method can comprise forming an inter-bar in at least one of the display areas of the first substrate and the second substrate. The forming of the inter-bar comprises: applying and pre-curing an interlayer material to at least one of the display area of the first substrate and the display area of the second substrate, and curing the interlayer material. The conductive member and the inter-bar can be cured with the interlayer material.

The conductive member can be applied through a nozzle moving along an imaginary line, starting discharging at a starting point and stop discharging at an end point. In some embodiments, the starting point and the end point do not overlap the touch sensor pad part when applying the conductive member.

Another aspect is a manufacturing method of a display device including a display area and a non-display area, the manufacturing method comprising: providing a first mother substrate including a plurality of first unit regions including a touch sensor and a touch sensor pad part, respectively, providing a second mother substrate including a plurality of second unit regions including a pixel and a connecting pad part, respectively corresponding to the first unit region, pre-cutting a portion of the first unit region of the first mother substrate along a cutting line, forming an interlayer on one of the display areas of the first mother substrate and the second substrate corresponding, forming a conductive member on the connecting pad part or in the touch sensor pad part, forming an inter-bar on one of the non-display area of the first mother substrate or the second substrate corresponding to the cutting line, coupling the first mother substrate to the second mother substrate, removing a pre-cut portion of the first mother substrate, and cutting the first and second mother substrates coupled along the first and second unit regions.

Another aspect is a display device comprising: a display area configured to display an image; a non-display area adjacent to the display area; a first substrate having a first side and including a touch sensor in the display area and a touch sensor pad in the non-display area; a second substrate opposite to the first substrate, the second substrate including a pixel in the display area and a connecting pad in the non-display area; a conductive member configured to electrically connect the touch sensor pad and the connecting pad; and an inter-bar interposed between the first and second substrates and between the first side of the first substrate and the touch sensor pad.

In the above display device, the second substrate has a first side, and wherein the first side of the first substrate has a different shape from the first side of the second substrate positioned below the first side of the first substrate.

In the above display device, the first side of the first substrate has a recess, and wherein the inter-bar extends along at least a portion of the first side of the first substrate.

In the above display device, the first substrate has the first side and second to fourth sides that form a rectangular shape, wherein the non-display area includes a pad area between the first side and the display area.

In the above display device, the inter-bar has an inseparable single body.

In the above display device, the inter-bar includes a plurality of inter-bars, wherein adjacent inter-bars are spaced apart from each other.

In the above display device, the first side is bent more than once.

The above display device further comprises an interlayer provided in the display area between the first and second substrates.

In the above display device, the interlayer has at least one side that extends from the second to fourth sides of the first substrate.

In the above display device, the inter-bar has two end portions that respectively contact the first and fourth sides of the first substrate.

In the above display device, the second substrate has a surface area that is larger than that of the first substrate, wherein the second substrate includes a non-overlapping portion that does not overlap the first substrate, and wherein a portion of the pad area is at least partially provided in the non-overlapping portion.

The above display device further comprises a driving pad in the non-overlapping portion of the second substrate.

In the above display device, the inter-bar is provided between the touch sensor pad and the first side.

In the above display device, the connecting pad includes a first connecting pad and a second connecting pad spaced apart from each other.

In the above display device, the inter-bar includes: a first inter-bar and a second inter-bar spaced apart from each other and respectively adjacent to the first and second connecting pad, and a third inter-bar between the first and second inter-bars.

In the above display device, the third inter-bar includes a bent portion extending in a direction from the first and second inter-bars to the display area.

The above display device further comprises a driving pad between the first and second connecting pad.

In the above display device, the third inter-bar is provided between the display area and the driving pads.

In the above display device, the conductive member is integrally formed with at least a portion of the inter-bar in an inseparable body.

In the above display device, at least the portion of the inter-bar comprises a plurality of conductive balls and an insulator surrounding the conductive balls.

In the above display device, the inter-bar includes the conductive balls and the insulator in a region in which the inter-bar overlaps the touch sensor pad in the depth dimension of the display device, wherein the inter-bar includes the insulator without the conductive balls in a region in which the inter-bar does not overlap the touch sensor pad in the depth dimension of the display device.

In the above display device, the conductive member extends in a lengthwise direction of the touch sensor pad.

In the above display device, the conductive member has a length greater than a length of the touch sensor pad in the lengthwise direction.

In the above display device, the conductive member has opposing end portions that do not overlap the touch sensor pad in the depth dimension of the display device.

In the above display device, the second substrate further comprises a driving pad configured to transmit an image signal to the display area, and wherein the inter-bar is provided between the display area and the driving pad.

In the above display device, the first substrate does not overlap the driving pad.

In the above display device, the touch sensor comprises: a plurality of sensing electrodes; and a plurality of wiring lines electrically connecting the sensing electrodes to the touch sensor pad.

In the above display device, the sensing electrodes include a plurality of first electrodes and a plurality of second electrodes crossing each other, wherein the touch sensor pad includes a first touch sensor pad connected to the first electrodes and a second touch sensor pad connected to the second electrodes.

In the above display device, the connecting pad includes a first connecting pad corresponding to the first touch sensor pads, and a second connecting pad corresponding to the second touch sensor pads.

In the above display device, the inter-bar includes a plurality of spacers and a binder including the spacers.

In the above display device, each of the spacers has a spherical shape.

In the above display device, the diameter of the spacers has a height less than or equal to that of the inter-bar.

Another aspect is a manufacturing method of display device including a display area and a non-display area, the manufacturing method comprising: forming a first substrate including a touch sensor in the display area and a touch sensor pad in the non-display area; forming a second substrate including a pixel and a connecting pad in the non-display area; pre-cutting a portion of the first substrate along a cutting line; forming a conductive member in the connecting pad or in the touch sensor pad; forming an inter-bar in at least the non-display area of the first substrate or the second substrate adjacent to the cutting line; attaching the first substrate to the second substrate; and removing the pre-cut portion of the first substrate.

In the above manufacturing method, the cutting line is provided in the non-display area, wherein the cutting line is bent toward the display area.

The above manufacturing method further comprises forming an interlayer over at least one of the display areas of the first substrate and the second substrate.

In the above manufacturing method, the forming of the interlayer comprises: applying an interlayer material to at least one of the display area of the first substrate and the display area of the second substrate; pre-curing the interlayer material; and curing the interlayer material.

In the above manufacturing method, the conductive member and the inter-bar are cured with the interlayer material.

In the above manufacturing method, the inter-bar is provided between the touch sensor pad and a first side of the first substrate.

In the above manufacturing method, the conductive member is integrally formed with at least a portion of the inter-bar in an inseparable body.

In the above manufacturing method, at least the portion of the inter-bar includes a plurality of conductive balls and an insulator, wherein the portion of the inter-bar overlaps the touch sensor pad in the depth dimension of the display device.

The above manufacturing method further comprises depositing the conductive member through a nozzle that is configured to move along an imaginary line, wherein the depositing includes starting discharging at a starting point and stopping discharging at an end point.

In the above manufacturing method, the starting point and the end point do not overlap the touch sensor pad in the depth dimension of the display device.

The above manufacturing method further comprises: providing a first carrier substrate supporting the first substrate to a backside of the first substrate; and providing a second carrier substrate supporting the second substrate on a backside of the second substrate.

The above manufacturing method further comprises respectively removing the first and second carrier substrates from the first and second substrates.

In the above manufacturing method, the pre-cut portion of the first substrate is removed together with the first carrier substrate when removing the first carrier substrate.

Another aspect is a manufacturing method of a display device including a display area and a non-display area, the manufacturing method comprising: providing a first mother substrate including a plurality of first unit regions, each first unit region including a touch sensor and a touch sensor pad; providing a second mother substrate including a plurality of second unit regions corresponding to the first unit regions, each second unit region including a pixel and a connecting pad; pre-cutting a portion of the first unit region of the first mother substrate along a cutting line; forming an interlayer over one of the display areas of the first mother substrate and the second substrate; forming a conductive member over the connecting pad or the touch sensor pad; forming an inter-bar over one of the non-display areas of the first mother substrate and the second mother substrate corresponding to the cutting line; coupling the first mother substrate to the second mother substrate; removing a pre-cut portion of the first mother substrate; and cutting the first and second mother substrates coupled along a boundary of the first and second unit regions.

In the above manufacturing method, the cutting line extends between two first unit regions that are adjacent to each other.

The above manufacturing method further comprises depositing the conductive member through a nozzle that moves along an imaginary line, wherein the depositing includes starting discharging at a starting point and stopping discharging at an end point.

In the above manufacturing method, the starting point and the end point do not overlap the touch sensor pad in the depth dimension of the display device.

In the above manufacturing method, the imaginary line extends between the first unit regions that are adjacent to one another.

DETAILED DESCRIPTION OF CERTAIN INVENTIVE EMBODIMENTS

Figure 1:
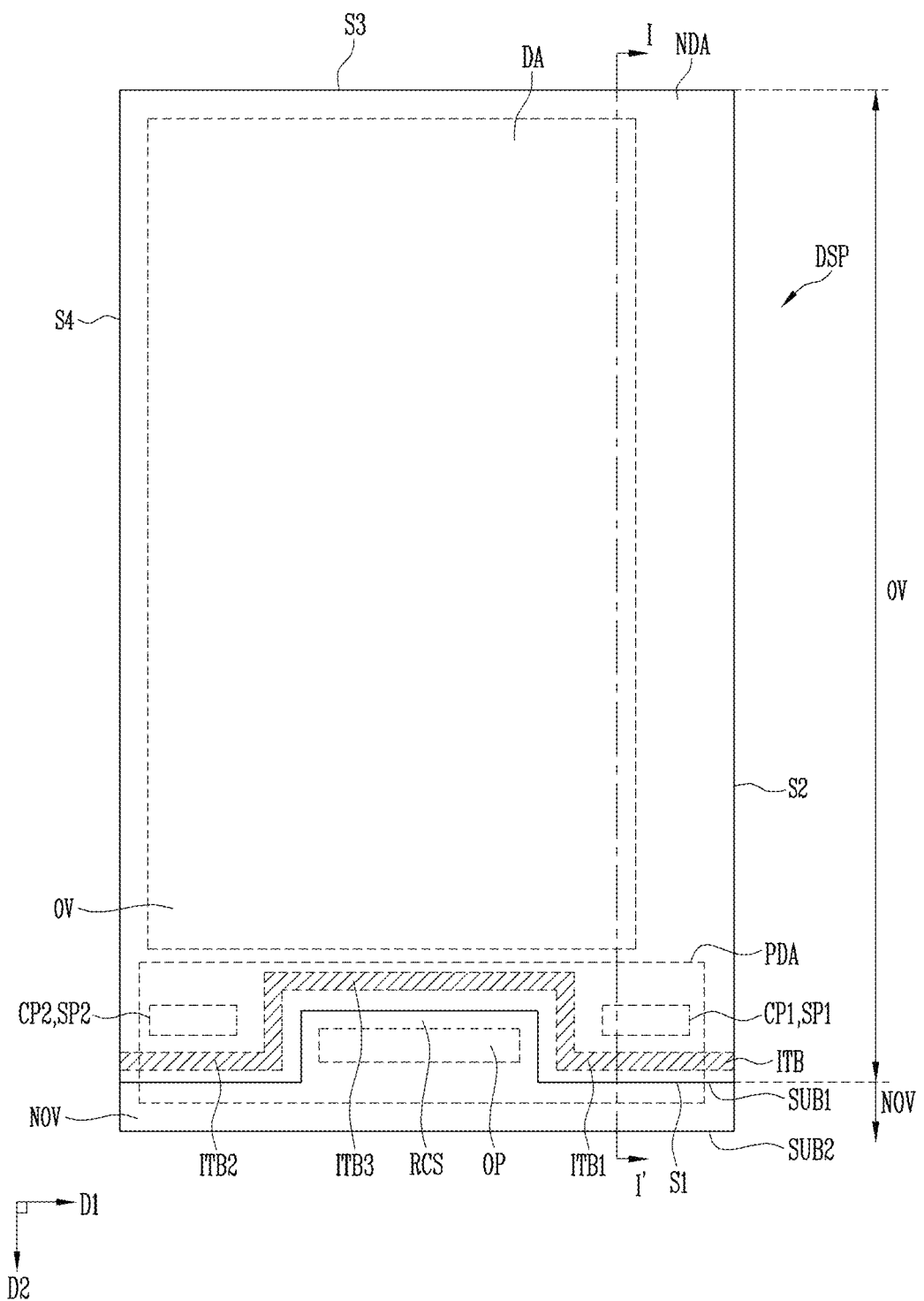
FIG. 1 is a plan view illustrating a display device according to an embodiment of the present disclosure.

While embodiments are described with reference to the accompanying drawings, it is to be understood that various changes and modifications can be made in the described technology without departing from the spirit and scope thereof. Further, it should be understood that the described technology is not limited to the specific embodiments thereof, and various changes, equivalences and substitutions can be made without departing from the scope and spirit of the described technology.

Like reference numerals designate like elements throughout the drawings. In the drawings, the dimension of elements can be exaggerated for the clarity. Although terms "first", "second", etc. are used herein to describe various elements, these elements should not be limited by these terms. These terms are only used to distinguish one element from another element. For example, the first element can be designated as the second element without departing from the scope of the described technology. Similarly, the second element can be designated as the first element. Further, the singular forms "a" and "an" include plural referents unless the context clearly dictates otherwise.

Herein, it should be understood that terms "include" or "have" are inclusive of characteristics, numerals, steps, operations, elements, parts or combination thereof, but are not exclusive of one or more different characteristics, numerals, steps, operations, elements, parts or combination thereof. Also, when an element, such as a layer, a film, a region or a plate, is referred to as being "under" another element, it can be right under the another element or be under the another element with one or more intervening elements interposed therebetween. In this disclosure, the term "substantially" includes the meanings of completely, almost completely or to any significant degree under some applications and in accordance with those skilled in the art. Moreover, "formed on" can also mean "formed over." The term "connected" includes an electrical connection.

Hereinafter, embodiments will be described in detail with reference to the accompanying drawings.

Figure 2:
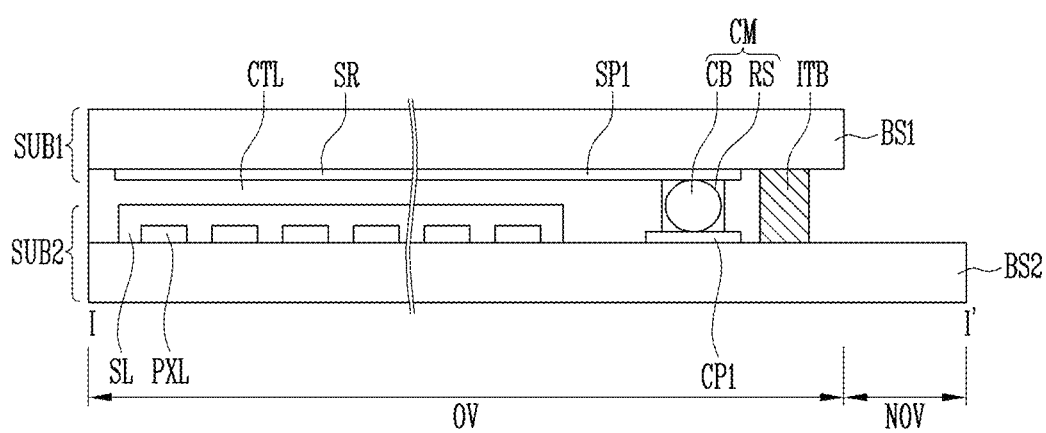
FIG. 2 is a cross sectional view taken along line I-I' of FIG. 1.
Figure 3:
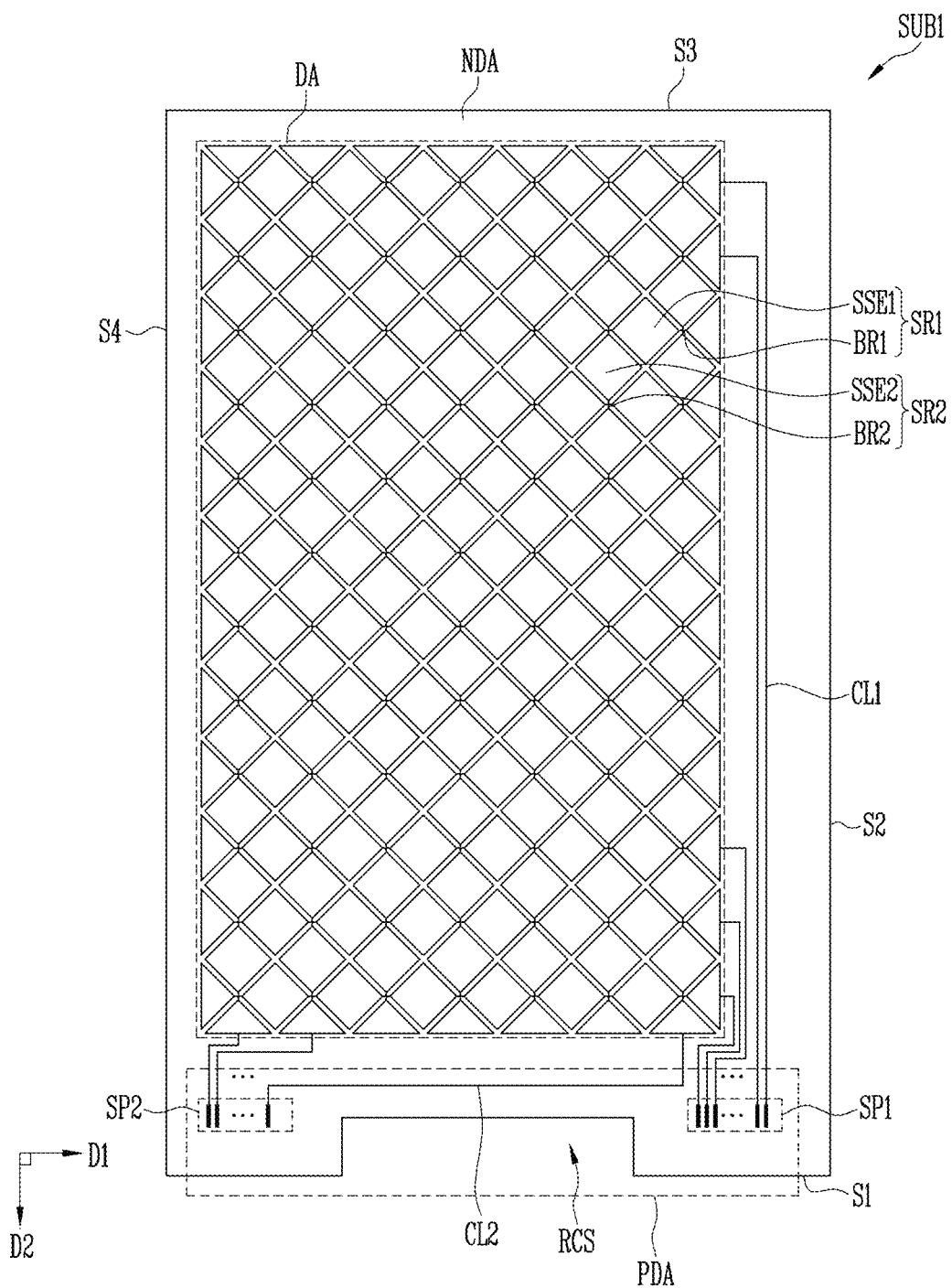
FIG. 3 is a plan view illustrating a first substrate of FIG. 1.
Figure 4:
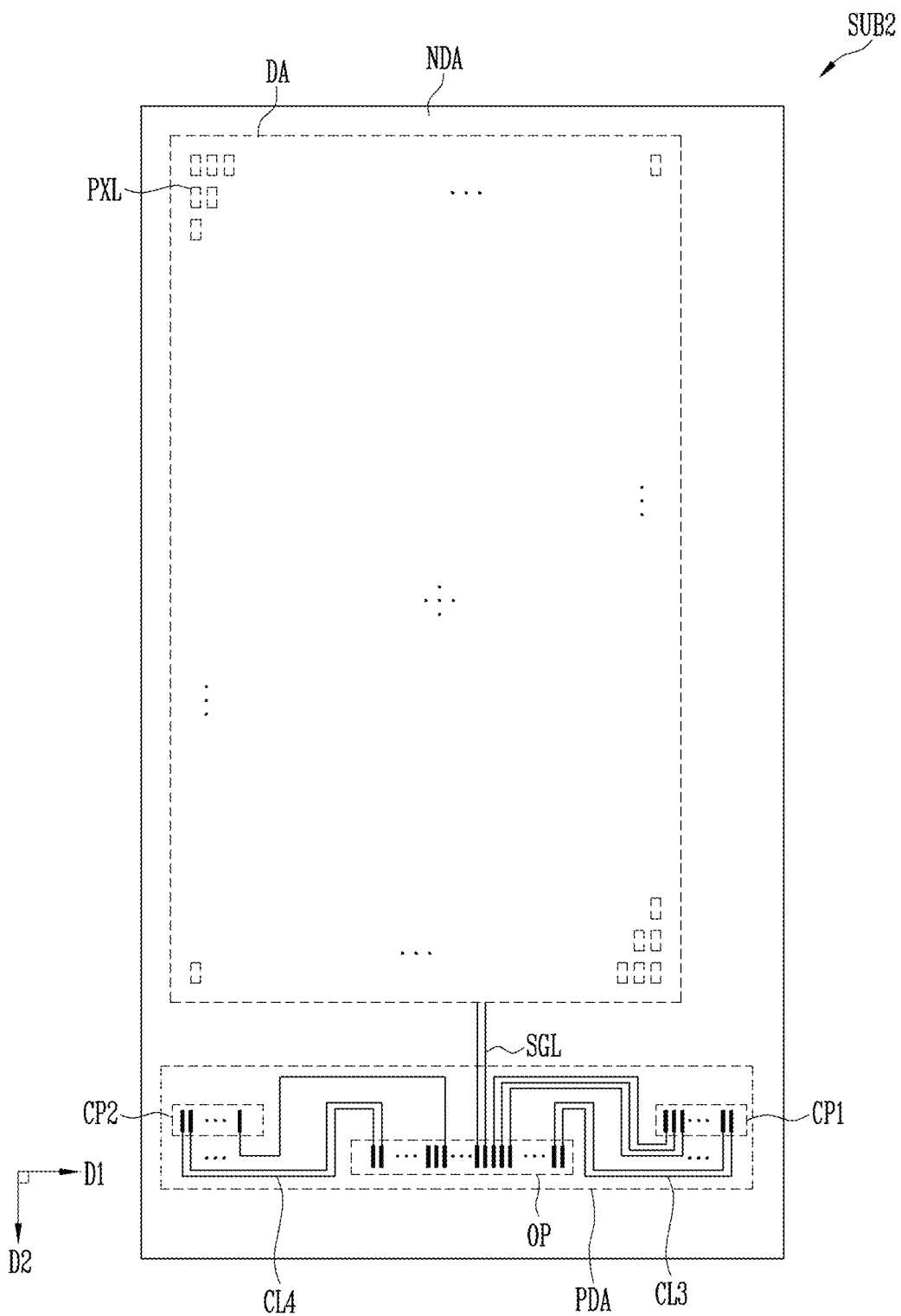
FIG. 4 is a plan view illustrating a second substrate of FIG. 1.

FIG. 1 is a plan view illustrating a display device DSP according to an embodiment of the present disclosure. FIG. 2 is a plan view taken along line I-I' of FIG. 1. FIG. 3 is a plan view illustrating a first substrate of FIG. 1. FIG. 4 is a plan view illustrating a second substrate of FIG. 1.

Referring to FIGS. 1 to 4, the display device DSP includes a display area DA and a non-display area NDA provided in surroundings of the display area DA.

The display area DA can be a region that displays an image, and the image can include any visual information, for example, a text, a video, a picture, a two-dimensional image or a three-dimensional image.

The non-display area NDA can be provided in the surroundings of the display area DA. In an embodiment of the present disclosure, the non-display area NDA is formed on at least one side of the display area DA, and formed along an edge of the display area DA as shown in the drawings. The non-display area NDA can include the pad area PDA in which pads of wiring lines are provided, and the pad area PDA can be formed on one side of the display area DA. The pad area PDA can include pads, for example, a touch sensor pad part, a connecting pad part, a driving pad part, etc., and a shape of the pad area PDA can vary in accordance with shapes of the touch sensor pad part, the connecting pad part, the driving pad part, etc.

The display device DSP can include a first substrate SUB1, a second substrate SUB2, an interlayer CTL provided between the first substrate SUB1 and the second substrate SUB2, conductive members CM, and an inter-bar ITB.

The first substrate SUB1 and the second substrate SUB2 can have various shapes, for example, a rectangular substrate having two pairs of sides in parallel. When the display device DSP has the rectangular substrate, one pair of the sides can be longer than another pair of the sides. For convenience, in an embodiment, the display device DSP includes the rectangular shape having one pair of short sides and another pair of long sides, and an extend direction of the short side is a first direction D, and an extend direction of the long side is a second direction D2. For convenience, one of the short sides of the display device DSP is a first side S1, and the other three sides sequentially connected to the first side S1 are a second side, a third side and a fourth side S2, S3 and S4.

According to an embodiment, an area of the first substrate SUB1 is smaller than an area of the second substrate SUB2. In a plan view, the second substrate SUB2 can include an overlapping portion OV that overlaps the first substrate SUB1, and a non-overlapping portion NOV that does not overlap the first substrate.

According to an embodiment, a first side of the first substrate SUB1 and a first side of the second substrate SUB2 can be not aligned with each other when viewed from the plan. Hereafter, the first side of the first substrate SUB1 refers to as S1, the first side of the second substrate SUB2 refers to as S1'.

According to an embodiment, the first substrate SUB1 have the same length of the second substrate SUB2 on the first direction D1 basis, and have shorter length of the second substrate SUB2 on the second direction D2 basis. Accordingly, the non-overlapping portion NOV can be provided between the first side S1 of the first substrate SUB1 and the first side S1' of the second substrate SUB2. In a plan view, remaining second, third and fourth sides S2, S3 and S4 can be substantially same as each other on the first substrate SUB1 and the second substrate SUB2.

According to an embodiment, portions of the display area DA and the non-display area NDA can be provided in the overlapping portion OV. The non-display area NDA can be provided in the non-overlapping portion NOV. The pad area PDA of the non-display area NDA can be provided over the overlapping portion OV and the non-overlapping portion NOV.

The first side S1 of the first substrate SUB1 can have a different shape from the first side S1' of the second substrate SUB2. The shape of the first side S1 of the first substrate SUB1 can vary in accordance with types and arrangements of the pad part in the pad area PDA. For example, in a plan view, the first side S1 of the first substrate SUB1 includes a recess RCS in which the portion of the non-display area is removed. According to an embodiment, in a plan view, the first side S1 of the first substrate SUB1 can be recessed toward a display area DA. Accordingly, the first side S1 of the first substrate SUB1 can extend in the first direction D1, but a portion bent in the second direction D2 can be partially provided. In the first substrate SUB1, a portion in which the recess RCS is formed can be shorter than a portion in which recess RCS is not formed.

In the non-overlapping portion NOV, a flexible printed circuit substrate to be connected to a driver of the outside can be attached (for example, a driving pad part OP to be described below). According to an embodiment, on an upper surface of the non-overlapping portion of the second substrate SUB2, although not shown, a detecting pad part to examine whether or not the pixels and other configuration elements are defective can be further included.

Although not shown, according to an embodiment, the first side S1 of the first substrate SUB1 can have a different shape from the first side S1' of the second substrate SUB2. For example, the first side S1 of the first substrate SUB1 can have a straight line shape extend in the first direction D1.

The first substrate SUB1 can include a first base substrate BS1, a touch sensor SR provided on the first substrate BS1, connecting lines connected to the touch sensor SR, and a touch sensor pad part SP provided in an end portion of the connecting lines.

The first base substrate BS1 can be formed of insulating material having flexibility. The first base substrate BS1 can be formed of various materials, for example, glass, polymer, metal, etc. The first base substrate BS1 can be an insulating substrate formed of polymer material. The insulating substrate including polymer organic materials can be polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, cellulose acetate propionate. However, the material of the first substrate SUB1 is not limited thereto. For example, the first substrate SUB1 can be formed of fiber glass reinforced plastic (FRP).

When a user touches the display device DSP, The touch sensor SR can sense the touch of the user and/or touch pressure, and be provided in the display area DA of the first substrate SUB1. The touch sensor SR can operate by a method of mutual capacitance that senses a change of capacitance caused by interaction between two types of sensing electrodes.

The touch sensor SR can include a plurality of first sensing units SR1 extending in the first direction D1 to which a sensing voltage is applied, and a plurality of second sensing units SR2 extending in the second direction D2 intersecting the other direction, for example, the first direction D1. The first sensing units SR1 can have an electrostatic combination with the second sensing units SR2, and a voltage can be changed by the electrostatic combination.

Each first sensing unit SR1 can include a plurality of first sensing electrodes SSE1 arranged in the first direction D1, and a plurality of first bridges BR1 which connect the first sensing electrodes SSE1 adjacent to one another. The first sensing electrodes SSE1 can be provided in a polygon shape, for example, a square shape, a stick type or a diamond type.

According to an embodiment, the first sensing electrodes SSE1 and the first bridges BR1 can be provided in a whole plate shape, or in a mesh shape having thin lines.

Each second sensing unit SR2 can include a plurality of second sensing electrodes SSE2 arranged in the second direction D2 and a plurality of second bridges BR2 which connect the second sensing electrodes SSE adjacent to one another. The second sensing electrodes SSE2 can be provided in the polygon shapes, for example, the square shape, the stick type or the diamond type.

The second sensing electrodes SSE2 and the second bridges BR2 can be provided in the whole plate shape, and the mesh shape having thin lines.

The first sensing electrodes SSE1 and the second sensing electrodes SSE2 are alternately arranged on a matrix configuration on the first base substrate BS1.

The first sensing unit SR1 and the second sensing unit SR2 can be insulated by each other. Specifically, FIG. 3 illustrates that the first bridges BR1 and the second bridges BR2 can cross each other, but practically the first bridges BR1 and the second bridges BR2 can be insulated from each other with insulating layers interposed therebetween. The first sensing units SR1 and the second sensing units SR2 can be provided in different layers from each other, but it is not limited thereto. According to an embodiment, the first sensing electrodes SSE1 and the second sensing electrodes SSE2 can be provided on the same layer, and the first bridges BR1 and the second bridges 2 BR2 can be provided on the different layers from each other.

The connecting lines (CL1 and CL2, hereafter CL) can connect the touch sensor SR to a driver (not shown) which drives the touch sensor SR and be provided in the non-display area NDA. The driver can be provided on the second substrate SUB2 to be described below, but provided at the outside, for example, on a separated printed circuit substrate, and include a position detecting circuit. The connection lines CL can transmit a sensing input signal from the driver to the first sensing units SR1 and the second sensing units SR2, or a sensing output signal from the first sensing units SR1 and the second sensing units SR2 to the driver.

According to an embodiment, the connecting lines CL can include a plurality of first connecting line CL1 and a plurality of second connecting line CL2. The first connecting lines CL1 can be connected to the first sensing units SR1. Each first connecting line CL1 can be connected to a column corresponding to the first sensing unit SR1. In a plan view, the first connecting lines CL1 can be bent a plurality of times in the non-display area NDA.

The second connecting lines CL2 can be connected to the second sensing units SR2. Each of the second connecting line CL2 can be connected to a row corresponding to the second sensing unit SR2. In a plan view, the second connecting lines CL2 can be bent in the non-display area NDA a plurality of times.

The touch sensor pad parts (SP1 and SP2, hereafter SP) can transmit a signal to the driver or from the driver between the touch sensor SR and the driver. The touch sensor pad part SP can be provided in the non-display area NDA. The touch sensor pad part SP can be adjacent to at least one of the four sides of the first substrate SUB1, and provided to the overlapping portion OV of the pad area PDA. According to an embodiment, the touch sensor pad part SP is provided in the non-display areas NDA adjacent to the first side S1 of the first substrate SUB1.

The touch sensor pad part SP can be connected to an end portion of the connecting lines CL. The touch sensor pad part SP can include a plurality touch sensor pads provided in the end portion of the connecting lines CL. The touch sensor pad part SP can be electrically connected to the connecting pad parts (CP1 and CP2, hereafter CP) of the second substrate SUB2 to be described below through a conductive member to be described below. The touch sensor SR can be connected to the connecting lines CL, and the touch sensor pad part SP can be connected to the end portion of the connecting lines CL, and touch sensor pad SP can be connected to the connecting pad part CP through the conductive member, and the connecting pad CP can be ultimately connected to the driver through the driving pad part OP to be described. To this end, a signal related to the touch sensor from the driver can be transmitted mutually.

The touch sensor pad part SP can include a first touch sensor pad part SP1 provided in the end portion of the first connecting lines CL1 and a second touch sensor pad part SP2 provided in the end portion of the second connecting lines CL2. In a plan view, the first touch sensor pad part SP1 and the second touch sensor pad part SP2 can be provided in the positions adjacent to each other, or in the positions spaced apart from each other. According to an embodiment, the first touch sensor pad part SP1 and the second touch sensor pad part SP2 can be provided on both sides of the first substrate SUB1 along the first direction D1, respectively, and spaced apart from each other.

According to an embodiment, the touch sensor SR, the connecting lines CL, and the touch sensor pad parts SP can be formed of the conductive materials. The conductive materials can include alloy, conductive polymer, conductive metal oxide and nano conductive compound. According to an embodiment, the metal can include copper, silver, gold, platinum, palladium, nickel, tin, aluminum, cobalt, rhodium, iridium, iron, ruthenium, osmium, manganese, molybdenum, tungsten, niobium, tantalum, titanium, bismuth, antimony, lead, etc. The conductive polymer can include polythiophene-based compound, polypyrrole-based compound, polyaniline-based compound, polyacetylene-based compound, polyphenylene-based compounds, and mixtures thereof, and PEDOT/PSS compound among polythiophene thiophene-based. The conductive metal oxide can include indium tin oxide (ITO), indium zinc oxide (IZO), antimony zinc oxide (AZO), indium tin zinc oxide (ITZO), zinc oxide (ZnO), tin oxide (SnO2). In addition, nano conductive compound can include silver nanowires, carbon nanotube, graphene.

According to an embodiment, the recess RCS can be formed in regions in which the touch sensor pad part SP is not provided. According to an embodiment, the touch sensor pad part SP can include the first touch sensor pad part SP1 and the second touch sensor pad part SP2, and the first touch sensor pad part SP1 and the second touch sensor pad part SP1 can be spaced apart from each other. As a result, the recess RCS can be provided in a region in which the first touch sensor pad part SP1 and the second touch sensor SP2 are spaced apart from each other.

The second substrate SUB2 can be opposite to the first substrate SUB1 and display the image.

The second substrate can include a second base substrate BS2, a pixel PXL provided on the second substrate BS2, a sealing layer SL covering the pixel PXL, signal lines SGL connected to the pixel PXL, a driving pad part OP provided in the end portion of the signal lines SGL, and a connecting pad part CP corresponding to the touch sensor pad part SP.

The second base substrate BS2 can be provided to correspond to a shape of the first base substrate BS1. The second base substrate BS2 can have a similar shape with that of the first base substrate BS1, and a larger area than that of the second substrate BS2. A plurality of pixels PXL can be provided in the display area DA and embody the image.

Figure 5A:
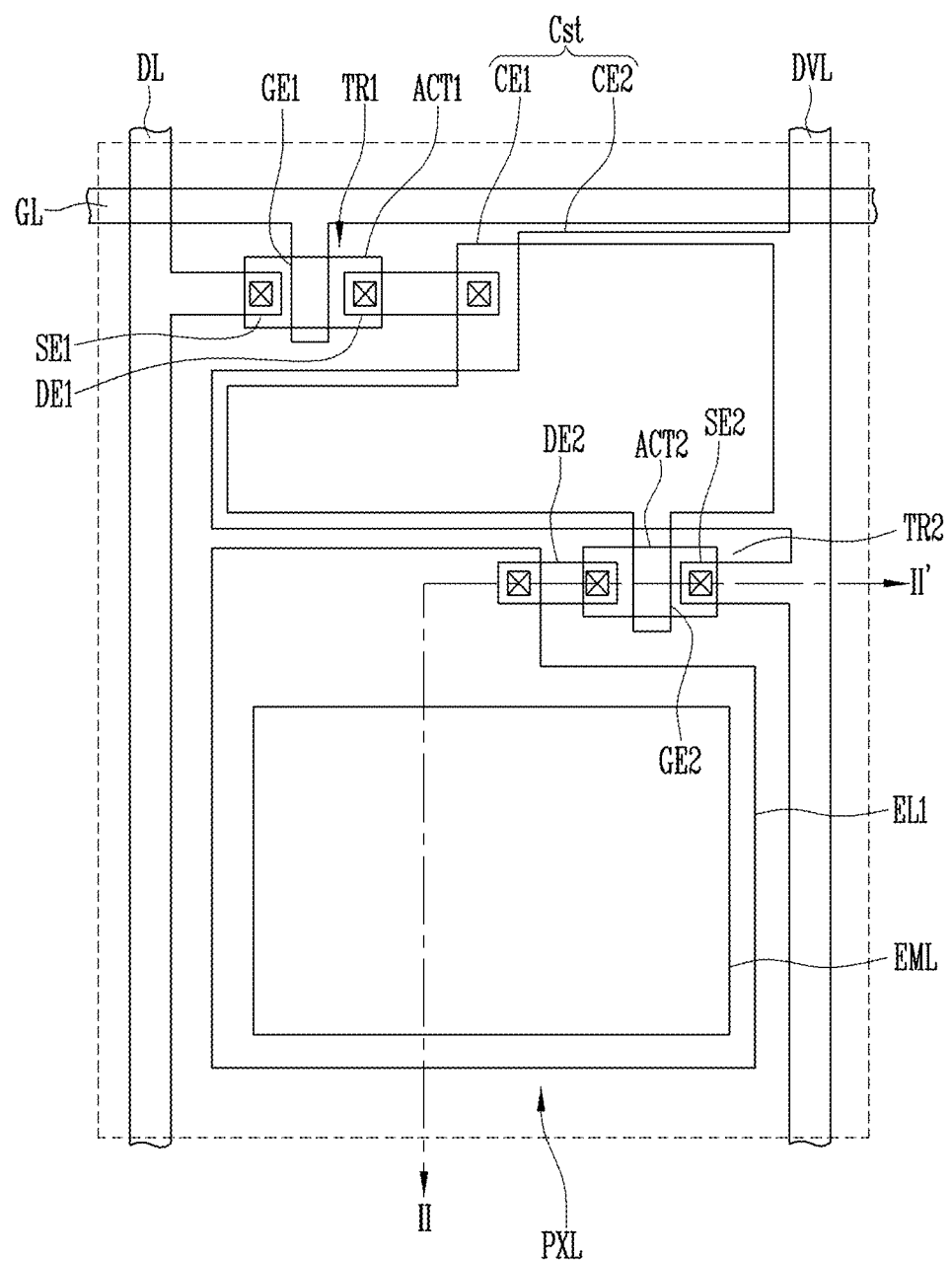
FIG. 5A is a plan view illustrating a single pixel.
Figure 5B:
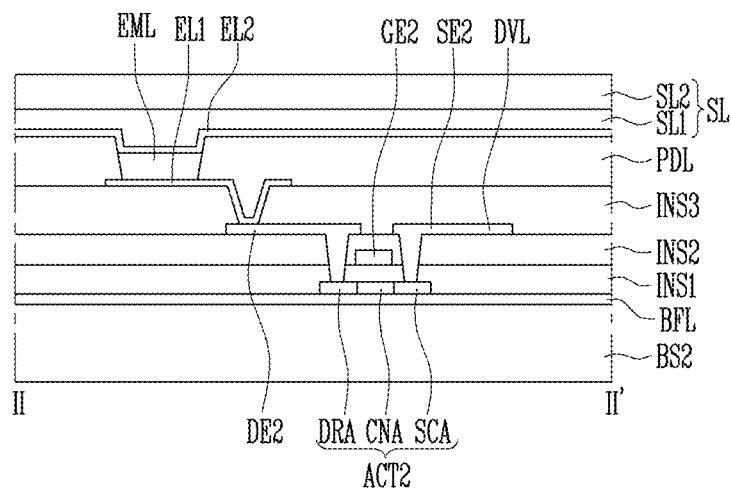
FIG. 5B is a cross-sectional view taken along line II-II' of FIG. 5A.

FIG. 5A is a plan view illustrating one pixel, and FIG. 5B is a cross sectional view take along line II-II' of FIG. 5A.

Referring to FIGS. 4, 5A and 5B, the pixel PXL is connected to the signal lines SGL. The signal lines SGL can provide a signal to each pixel PXL, and include a gate line GL, a data line DL, and a driving voltage line DVL, further include other wiring lines as occasion demands.

The gate lines GL can extend in one of the first direction D1 and the second direction D2. The data line DL can extend in a direction intersecting the gate lines GL. The driving voltage line DVL can extend in a direction substantially same as the data lines DL. The gate line GL can transmit a scanning signal to the thin film transistor, the data line DL can transmit a data signal to the thin film transistor, and the driving voltage line DVL can provide a driving voltage to the thin film transistor.

A plurality of gate lines GL, a plurality of data lines DL, and a plurality of driving voltage lines DVL can be provided.

Each signal line SGL can be provided over the display area and the non-display area NDP.

The pixel PXL can display the image and be provided in the display area DA. A plurality of pixels PXL can be arranged in the matrix configuration. According to an embodiment, for convenient of explanation, one pixel PXL is illustrated in FIGS. 2A and 2B. Each pixel PXL is illustrated to have a rectangular shape, but it not limited thereto, and modified in various shapes. In addition, the pixels PXL can have different areas from each other. For example, when the pixels are in different colors, an area or a shape of each pixel can be different in accordance with each color.

Each pixel PCL can include a thin film transistor connected to a corresponding signal line, among the signal lines SGL, a light emitting element connected to the thin film transistor, and a capacitor Cst.

The thin film transistor can include a driving thin film transistor TR2 to control the light emitting element, and a switching thin film transistor TR1 that switches the thin film transistor TR2. According to an embodiment, one pixel PXL can include two thin film transistors TR1 and TR2, but it is not limited thereto. One pixel PXL can include one thin film transistor and one capacitor, or more than two thin film transistors and more than one capacitor.

The switching thin film transistor TR1 can include a first gate electrode GE1, a first source electrode SE1, and a first drain electrode DEL The first gate electrode GE1 can be connected to the gate line GL, and the first source electrode SE1 can be connected to the data line DL. The first drain electrode DE1 can be connected a gate electrode of the driving thin film transistor TR2 (that is, a second gate electrode GE2). The switching thin film transistor TR1 can transmit a data signal applied to the date line DL to the driving thin film transistor TR2 according to a scanning signal applied to the gate line GL.

The driving thin film transistor TR2 can include a second gate electrode GE2, a second source electrode SE2 and a second drain electrode DE2. The second gate electrode GE2 can be connected to the switching thin film transistor TR1 and the second source electrode EL2 can be connected to the driving voltage line DVL, and the second drain electrode DE2 can be connected to the light emitting element.

The light emitting element can include the light emitting layer EML, a first electrode EL1 and a second electrode EL2 with the light emitting layer EML interposed therebetween. The first electrode EL1 can be connected to the second drain electrode DE2 of the thin film transistor TR2. A common voltage can be applied to the second electrode EL2, and light emitting layer EML can emit the light according to an output signal of the driving thin film transistor TR2 or display the image by emitting the light or not. The light emitted from the light emitting layer EML can vary in accordance with material of the light emitting layer and be color light or white light.

According to an embodiment, the light emitting element and the light emitting layer EML can be provided in various shapes within an area in which each pixel PXL is provided. According to an embodiment, the light emitting layer EML does not overlap the thin film transistor, but it not limited thereto. The light emitting layer EML can overlap the thin film transistors in part or most of the thin film transistors. A shape or an area of a region in which the light emitting element is provided within the region in which the pixel PXL is provided, can be set differently according to an image outputting direction of the display device.

The capacitor Cst can be connected between the second gate electrode GE2 and the second source electrode SE2 of the driving thin film transistor TR2, and charge and maintain the data signal input to the second gate electrode GE2 of the driving thin film transistor TR2.

Hereafter, the pixel according to an embodiment is now described according to a stacking order.

The pixel according to an embodiment can be provided on the second base substrate BS2.

A buffer layer BFL can be formed on the second base substrate BS2. The buffer layer BFL can block impurities from being diffused to a switching or the driving thin film transistors TR1 and TR2. The buffer layer BFL can be formed of Silicon nitride (SiNx), silicon oxide (SiOx), silicon oxynitride (SiOxNy), silicon nitride (SiNx), silicon oxide (SiOx) and silicon oxynitride (SiOxNy), and removed according to the material or a process condition of the base substrate BS.

A first active pattern ACT1 and a second active pattern ACT2 can be provided on the buffer layer BFL. The first active pattern ACT1 and the second active pattern ACT2 can be formed of semiconductor material. The first active pattern ACT1 and the second active pattern ACT2 can include a source region SCA, a drain region DA, and a channel region CN1 provided between the source region SCA and the drain region DRA, respectively. The first active pattern ACT1 and a second active pattern ACT2 can be a semiconductor pattern formed of polysilicon, amorphous silicon, and an oxide semiconductor. Specifically, the channel region CNA can be the semiconductor pattern which is not doped with the impurities which is intrinsic semiconductor. The source region SCA and the drain region DRA can be the semiconductor pattern doped with the impurities. N type impurity, p type impurity, and metal can be doped therein. A first insulating layer INS1 can be provided on the first active pattern ACT1 and the second active pattern ACT2.

On the first insulating layer INS1, the first gate electrode GE1 and the second gate electrode GE2 connected to the gate lines GL can be provided. The first gate electrode GE1 and the second gate electrode GE2 can be formed to cover a region corresponding to the channel region CAN of the first active pattern ACT1 and the second active pattern ACT2, respectively.

A second insulating layer INS2 can be provided on the first and second gate electrodes GE1 and GE2 to cover thereof.

The first source electrode SE1 and the first drain electrode DE1, and the second source electrode SE2 and the second drain electrode DE2 can be provided on the second insulating layer INS2. The first source electrode SE1 and the first drain electrode DE1 can contact a source region SCA and a drain region DRA of the first active pattern ACT1, respectively, by a contact hole formed in the first insulating layer INS1 and the second insulating layer INS2.

The second source electrode SE2 and the second drain electrode DE2 can contact a source region SCA and a drain region DRA of the second active pattern ACT2, respectively, by the contact hole formed in the first insulating layer INS1 and the second insulating layer INS2

On the other hand, a portion of the second gate electrode GE and a portion of the driving voltage line DVL can be the first capacitor electrode CE1 and the second capacitor electrode CE2, respectively, and constitute the capacitor Cst with the second insulating layer INS2 therebetween.

A third insulating layer INS3 can be provided on the first source electrode SE1 and the first drain electrode DE1, and the second source electrode SE2 and the second drain electrode DE2. The third insulating payer INS3 can be a protective layer which protects the switching and the driving thin film transistors TR1 and TR2, or a planarized layer which planarizes an upper face.

On the third insulating layer IN3, the first electrode EL1 can be provided as an anode of the light emitting element. The first electrode EL1 can be connected to the second drain electrode DE2 of the thin film transistor TR2 through a contact hole formed in the third insulating layer INS3. The first electrode EL1 can be cathode but the first electrode EL1 as the anode can be described below.

The first electrode EL1 can be formed of material having a high work function, and when the image is provided in a lower direction of the base substrate BS, the first electrode EL1 can be formed of transparent conductive layer, for example, indium tin oxide (ITO), indium zinc oxide (IZO), zinc oxide (ZnO), indium tin zinc oxide (ITZO). When the image is provided in an upper direction of the base substrate BS, the first electrode EL1 can be formed of a metal reflective layer, for example, Ag, Mg, Al, Pt, Pd, Au, Ni, Nd, Ir and Cr or transparent conductive layer, for example, indium tin oxide (ITO), indium zinc oxide (IZO), zinc oxide (ZnO), indium tin zinc oxide (ITZO).

A pixel definition layer PDL which divides a pixel region to correspond to each pixel PXL can be provided on the second base substrate BS2 in which the first electrode EL1 is provided. The pixel definition layer PDL can expose the upper face of the first electrode EL1, and protrude from the base substrate BS along an edge of the pixel PXL.

The light emitting layer EML can be provided in the pixel region surrounded by the pixel definition layer PDL, and the second electrode EL2 can be provided on the light emitting layer EML.

The sealing layer SL can be provided on the second electrode EL2 and cover the second electrode EL2. The sealing layer SL can be formed of a single layer. According to an embodiment, the sealing layer SL can include a first sealing layer SL1 and a second sealing layer SL2. The first sealing layer SL1 and the second sealing layer SL2 can include different materials from each other. For example, the first sealing layer SL1 can be formed of organic material, and the second sealing layer SL2 can be formed of inorganic material. However, whether the sealing layer SL is the double layer is or not and the material thereof are not limited, but changed in various shapes. For example, the sealing layer SL can include a plurality of organic material layers alternately stacked and a plurality of inorganic material layers.

Referring to FIGS. 1 to 4, FIGS. 5A and 5B, the connecting pad part CP can be provided in a position corresponding to the touch sensor pad part SP of the first substrate SUB1 in the non-display area NDA and have a substantially same shape with the connecting pad part CP. In a plan view, the connecting pad part CP can overlap the touch sensor pad part SP. The connecting pad part CP can include the connecting pads corresponding to the touch sensor pads of the touch sensor pas unit SP, respectively. The connecting pad part CP can transmit the signal to the driver or from the driver, and be electrically connected through the touch sensor pad part SP of the first substrate SUB1 and the conductive member CM described below.

The connecting pad part CP can include a first connecting pad part CP1 corresponding to the first touch sensor pad part SP1, and a second connecting pad part CP2 corresponding to the second touch sensor pad part SP2.

Additional connecting lines can be connected to the connecting pad part CP. A third connecting line CL3 can be connected to the first connecting pad part CP1, and a fourth connecting line CL4 can be connected to the second connecting pad part CP2.

The signal lines SGL can be connected to the pixels PXL. The signal lines SGL can provide the signal related to the image to the pixels PXL. For example, the gate line GL can transmit the scanning signal from the driver to the thin film transistor, the data line DL can transmit the data signal to the thin film transistor, and the driving voltage line DVL can provide the driving voltage to the thin film transistor. Although not shown, the signal lines can additionally include various lines to embody the images, and various signals can be applied to each signal line.

The driving pad part OP can be provided in the non-display area NDA of the second base substrate BS2, and in the non-overlapping region NOV of the pad area PDA. The driving pad part OP can be provided in a suitable position according to a shape of the first side S1 of the first substrate SUB1. When the first side S1 of the first substrate SUB1 includes the recess RCS, driving pad part OP can be provided in the region corresponding to the recesses RCS of the first substrate SUB1. According to an embodiment, the recesses RCS of the first substrate SUB1 can be provided in a part in which the first touch sensor pad part SP1 and the second touch sensor pad part SP2 are spaced apart from each other such that the driving pad part OP can be provided between the first touch sensor pad part SP1 and the second touch sensor pad part SP2 in a plan view.

The driving pad part OP, the signal lines SGL and end portions of the additional lines which are a third connecting lines CL3 and the fourth connecting lines CL4 can be connected. The driving pad part OP can include a plurality of driving pads provided in the end portion of the signal lines SGL. The driving pad part OP can transmit the signal to or from the driver to the pixels PXL and the connecting pad part CP.

Although not shown, another configuration element, for example, a flexible printed circuit substrate can be connected to the driving pad part OP with a separate conductive member interposed therebetween.

The connecting pad part CP, the signal lines SGL, the additional connecting lines, and the driving pad part OP can be formed of conductive material. The conductive material can include metal, alloy thereof, conductive polymer, conductive metal oxide and nano conductive material. According to an embodiment, the metal can include copper, silver, gold, platinum, palladium, nickel, tin, aluminum, cobalt, rhodium, iridium, iron, ruthenium, osmium, manganese, molybdenum, tungsten, niobium, tantel, titanium, bismuth, antimony, and lead. The conductive polymer can include polythiophene-based compound, polypyrrole-based compound, and polyaniline-based compound, it can be mentioned a polyacetylene-based compound, polyphenylene-based compounds, and mixtures thereof. Specifically, the conductive metal oxides can include PEDOT/PSS among polythiophene-based PEDOT/PSS compound. The conductive metal oxide can include indium tin oxide (ITO), indium zinc oxide (IZO), antimony zinc oxide (AZO), indium tin zinc oxide (ITZO), zinc oxide (ZnO), tin oxide (SnO2). In addition, the nano conductive compounds can include silver nanowires, carbon nanotube, and graphene.

The connecting pad part CP, the signal lines SGL, the additional lines, and the driving pad part OP can be manufactured when forming the pixels PXL.

As described above, according to an embodiment, the first substrate SUB1 and the second substrate SUB2 can be provided in the display device DSP, and the interlayer CTL, the conductive members CM, and the interlayer ITB can be provided between the first substrate SUB1 and the second substrate SUB2.

The interlayer CTL can be provided in the display area DA between the first substrate SUB1 and the second substrate SUB2.

The interlayer CTL can protect the touch sensor SR of the first substrate SUB1, and attach the first substrate SUB1 to the second substrate SUB2. The interlayer CTL can have the adhesive to perform bonding function. The interlayer CTL can be filled between the first substrate SUB1 and the second substrate SUB2.

The interlayer CTL can be formed of transparent material to transmit the image from the second substrate SUB2. Further, the interlayer CTL can be formed of insulating material and have flexibility.

The material of the interlayer CTL can protect the touch sensor of the first substrate SUB1, attach the first substrate SUB1 to the second substrate SUB2, and types thereof is not limited. According to an embodiment, the interlayer CTL can be formed of organic material. The organic material can be UV curable or thermosetting and selected from various organic polymer material. For example, the organic material can include epoxy resin. The epoxy resin can be bisphenol A type, bisphenol F type, bisphenol AD type, bisphenol S type, phenol novolak type, cresol novolak type, multi ridge, tetraphenyl roll methane type, polyethylene glycol type, polypropylene glycol type, hexanediol type, trimethylol pro plate, bisphenol a propylene oxide, or mixtures thereof.

The interlayer CTL can expand to the display area DA and the non-display area DNA adjacent to the display area DA. For example, a sidewall of the interlayer CTL corresponding at least one side of the second to fourth sides S1, S2, S3 and S4 can be exposed to the outside. In some embodiments, another configuration element is not included at the outside the interlayer CTL, and the sidewall of the interlayer CTL can be arranged at the outmost. Accordingly, the sidewall of the interlayer CTL can be exposed to the outside on the second, third and fourth sides S2, S3 and S4, except for the first side S1 of the first substrate SUB1.

The sidewall corresponding to the first side S1 of the first substrate SUB1 of the interlayer CTL can contact the inter-bar ITB to be described below. The description thereof will be followed below.

The conductive member CM can be provided between the first substrate SUB1 and the second substrate SUB2, and connect the touch sensor pad part SP of the first substrate SUB1 with the connecting pad part CP of the second substrate SUB2. In a plan view, the conductive member CM can be formed in a region in which the touch sensor pad part SP and the connecting pad part CP are formed. The conductive member CM can overlap the touch sensor pad part SP and the connecting pad part CP. In some embodiments, the conductive member CM is not provided in a region where the touch sensor pad part SP and the connecting pad part CP are not formed. When the touch sensor pad part SP includes the first touch sensor pad part SP1 and the second touch sensor pad part SP2 spaced apart from each other, the conductive member CM can be provided on the first touch sensor pad part SP1 and the second touch sensor pad part SP2, and the conductive members CM provided in the first touch sensor pad part SP1 and the second touch sensor pad part SP2 can be spaced apart from each other.

The conductive member CM can include a plurality of conductive balls and an insulator RS surrounding the conductive balls CB.

The conductive balls CB can include electrical conductivity, but types thereof are not limited. According to an embodiment, the conductive balls CB can use nickel, iron, copper, aluminum, tin, zinc, chromium, cobalt, silver, gold, metals such as antimony, or particles with conductivity such as a compound containing the metal, an oxide of the metal, for example, a solder, carbon. According to another embodiment, the conductive balls CB can be particles in which a thin layer of metal is formed by a method of having electroless nucleating agent in the surface such as plating method. An organic polymer is used as the polymer, for example, different types of epoxy resin can be used. According to an embodiment, the bisphenol epoxy resin —F can be used as epoxy resins. For example, various kinds of epoxy resins can be used. According to an embodiment, epoxy resins are used as the bisphenol epoxy resin —F. Or, the conductive ball (CB) can use the conductive particle itself and a coated particle which is coated by insulator on a particle surface on which metal thin film is formed.

The insulator RS can have the adhesive, and the material which firmly attaches the touch sensor unit SP to the connecting pad part CP can be used, but the type thereof is not limited. According to an embodiment, the insulator RS can include a rubber-based resin and/or a polymer resin. The polymer resin can be thermoplastic polymer resin, a thermosetting polymer resin, a radically polymerizable polymer resin.

Styrene-butadiene resin, ethylene vinyl resin, polyester resin, silicone resin, phenoxy resin, acrylic resin, polyamide-based resins, acrylate-based resin, or and the like a polyvinyl butyral resin, wherein the thermosetting resin is an epoxy resin, a phenol there is resin, or melamine resin. The radically polymerizable resin include methyl acrylate, ethyl acrylate, bisphenol A ethylene glycol-modified diacrylate, isocyanuric acid ethylene glycol-modified diacrylate, tripropylene glycol diacrylate, tetraethylene glycol diacrylate, polyethylene glycol diacrylate, pentaerythrityl stall triacrylate, trimethylol propane triacrylate, trimethylol propane propylene glycol triacrylate, trimethylolpropane ethylene glycol triacrylate, Acrylate of isocyanuric acid ethylene glycol-modified triacrylate, dipentaerythritol pentaacrylate, dipentaerythritol hexaacrylate, pentaerythrityl stall tetraacrylate, dicyclopentenyl acrylate, tricyclodecanyl acrylate-based, methacrylate, maleimide compounds, unsaturated polyester, acrylic acid, vinyl acetate, acrylonitrile, or methacryloyl nitrile compound In the drawings, a single conductive member CB is illustrated, but it is for convenience of explanation, and the plurality of the conductive member CB can be provided in the conductive member CM.

Each conductive ball CB can be provided in the spherical shape or in the oval shape between the first substrate SUB1 and the second substrate SUB2. The conductive ball CB can be provided in the oval shape between the touch sensor pads and the connecting pads opposite to each other, and the conductive ball CB can be provided in the spherical shape in the other portions. The conductive ball CB can be provided in the spherical shape, but modified to the oval shape by compressing in an up-and-down direction between the first substrate SUB1 and the second substrate SUB2 during a manufacturing process of the display device. A gap between the touch sensor pads and the connecting pads opposite to each other can be narrow than a gap between the touch sensor pads and the connecting pads which are opposite to each other, accordingly, the conductive member SM between the touch sensor pads and the connecting pads opposite to each other can be provided in the overall oval shape according to a gap between two substrates.

Average diameters of the conductive balls CB can be selected as a different value according to a gap between the first substrate SUB1 and the second substrate SUB2 in the display device.

The inter-bar ITB can be provided in the non-display area NDA between the first substrate SUB1 and the second substrate SUB2 so that the inter-bar ITB is adjacent to the connecting pad part CP.

According to an embodiment, the inter-bar ITB can be provided between the display area DA and the first side S1 of the first substrate SUB1. For example, the inter-bar ITB can be provided between the first side S1 of the first substrate SUB1 and the connecting pad part CP.

The inter-bar ITB can attach the first substrate SUB1 to the second substrate SUB2, and in the cross sectional view, the inter-bar ITB can be provided between the interlayer CTL and the conductive member CM. The sidewall of the display area DA of the inter-bar ITB can directly contact the interlayer CTL.

The inter-bar ITB can be adjacent to the conductive member CM and stably attach the first substrate SUB1 to the second substrate SUB2, thereby protecting the conductive member CM from being separated from the first substrate SUB1 or the second substrate SUB2.

According to an embodiment, the inter-bar ITB is not provided on the second to fourth sides S2, S3 and S4, but only on the first side S1 of the first substrate SUB1. At least a portion of the inter-bar ITB can extend along an edge of the first side S1 of the first substrate SUB1. The inter-bar ITB can be adjacent to the first side S1 of the first substrate SUB1. For example, a distance between the inter-bar ITB and the first side S1 of the first substrate SUB1 can be less than about 2 mm. When the distance between the inter-bar ITB and the first side S1 of the first substrate SUB1 is more than about 2 mm, a gap can be generated between the conductive member CM and the first and second substrates SUB1 and SUB2, and it can cause a contact error.

The first side S1 of the first substrate SUB1 can have the substantially same shape with the inter-bar ITB despite of some length differences. According to an embodiment, in a plan view, the first side S1 of the first substrate SUB1 can be bent more than once, and include a portion extend in the first direction D1 and a portion extend in the second direction D2. Correspondingly, the inter-bar ITB can be bent more than once, and include a portion extend in the first direction D1 and a portion extend in the second direction D2.

The inter-bar ITB can include a first inter-bar ITB1 and a second inter-bar ITB2 spaced apart from each other corresponding to the first and second touch sensor pad parts SP1 and SP2 and a third inter-bar ITB3 provided between the first and second inter-bars ITB1 and ITB2.

The third inter-bar ITB3 can be provided between the first and second touch sensor pad parts SP1 and SP2 on the first direction D1 basis, and between the display area DA and the first side S1 of the first substrate SUB1 on the second direction basis.

According to an embodiment, in a plan view, the third inter-bar ITB3 can be bent in the direction from display DA to the first and second inter-bars ITB1 and ITB2.

The inter-bar ITB can be provided as an integrated unit. According to an embodiment, the first to third inter-bars ITB1 to ITB3 can be formed in the integrated unit along the first side S1 of the first substrate SUB1. According to an embodiment, one end portion of the inter-bar ITB can meet the fourth side S4 and another end portion of the inter-bar ITB can meet the second side S2.

The inter-bar ITB can include the insulating material having the adhesive, but the type thereof is not limited. According to an embodiment, the inter-bar ITB can include rubber-based resin and/or epoxy resin, the epoxy resin, bisphenol A type, bisphenol F type, bisphenol AD type, bisphenol S type, greater silane nolhyeong, phenol novolak type, cresol novolak type, multi ridge, tetraphenyl roll methane type, polyethylene glycol type, poly propylene glycol type, hexanediol type, trimethylol pro plate, bisphenol a propylene oxide, or mixtures thereof.

According to an embodiment, a height of the inter-bar ITB can be smaller than the average diameter of the conductive balls CB.

According to an embodiment, the inter-bar ITB can include spacers and a binder (not shown) surrounding the spacers (not shown.)

The spacer can control the height and a width of the inter-bar ITB.

The spacer can be provided in various shapes. According to an embodiment, the spacer can be provided in the spherical shape and is not elastic or is partially elastic. The spacer can maintain minimum gap between the first and second substrates SUB1 and SUB2 when the first and second substrates SUB1 and SUB2 are compressed each other. A plurality of spacers can be provided in the binder, and the diameter of the inter-bar ITB can be the same as or smaller than the entire height of the inter-bar ITB.

The spacer can be manufactured of the polymer material including silicon oxide, but the material is not limited thereto.

The display device having the structure can be manufactured by a method below. FIGS. 6A to 6G are cross sectional views sequentially illustrating a method of manufacturing display device according to an embodiment.

Referring to FIGS. 1 to 4 and 6A, the first substrate SUB1 can be manufactured. The first substrate SUB1 can prepare the first base substrate BS1, and the touch sensor SR, the connecting lines CL, and the touch sensor pad parts SP can be formed on the first base substrate BS1.

To effectively form the touch sensors SR on the first base substrate BS1, a first carrier substrate CR1 that supports the first base substrate BS1 can be provided in a lower part of the first base substrate BS1.

The first base substrate BS1 can be manufactured by curing and the like after being applied to the first carrier substrate CR1.

Since the touch sensor SR, the connecting lines CL, and the touch sensor pad part SP can be formed on the first base substrate BS1 by various processes, for example, the touch sensor SR, the connecting lines CL, and the touch sensor pad part SP can be formed by using photolithography at least once.

Referring to FIGS. 1 to 4 and 6B, the portion of the first substrate SUB1 in which the touch sensor SR is formed can be pre-cut. A portion of the non-display area NDA corresponding to the first side S1 of the first substrate SUB1 can be pre-cut.

Figure 7:
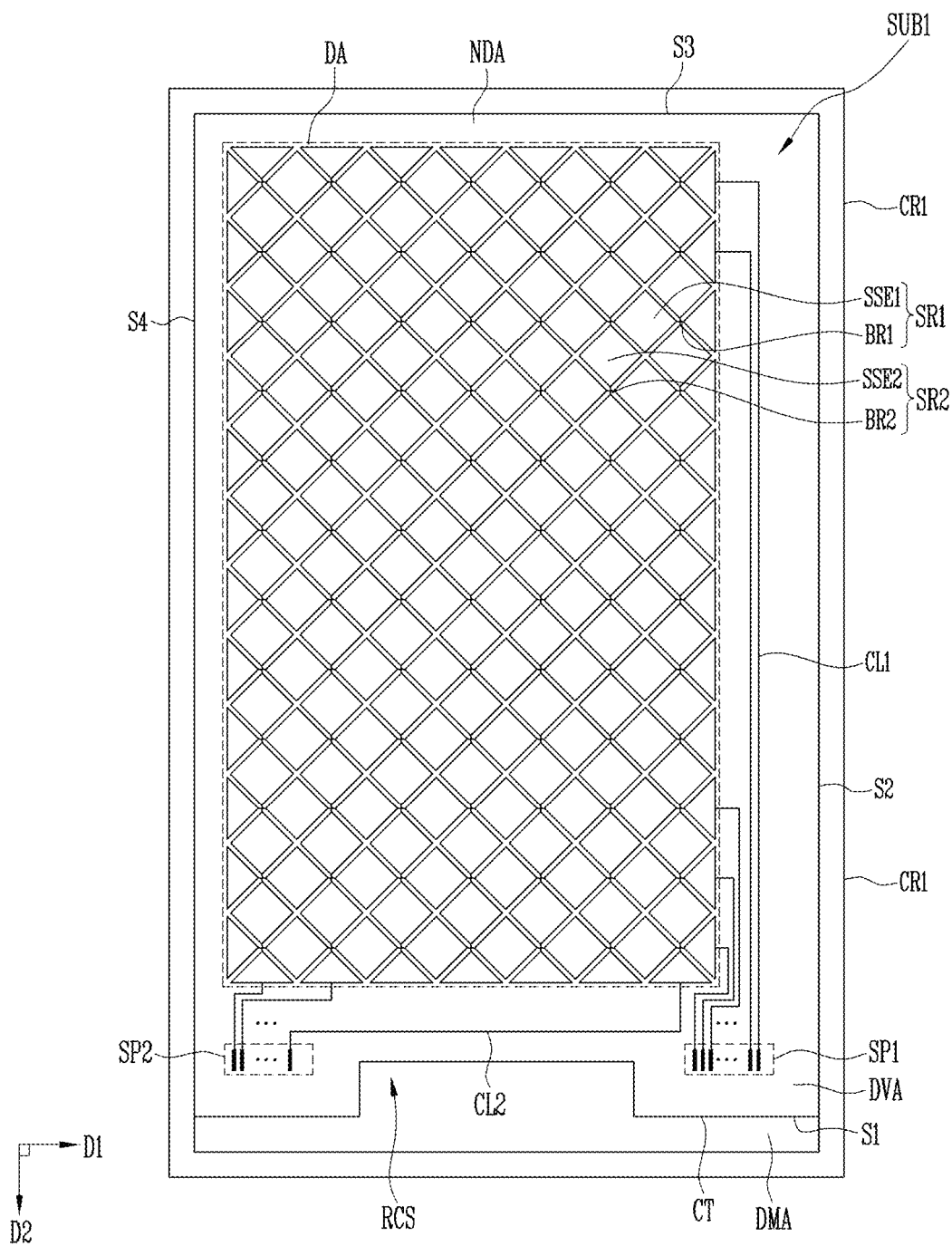
FIG. 7 is a plan view illustrating pre-cutting a first substrate.

FIG. 7 is a plan view of the first substrate describing pre-cutting of the first substrate.

Figure 6A:
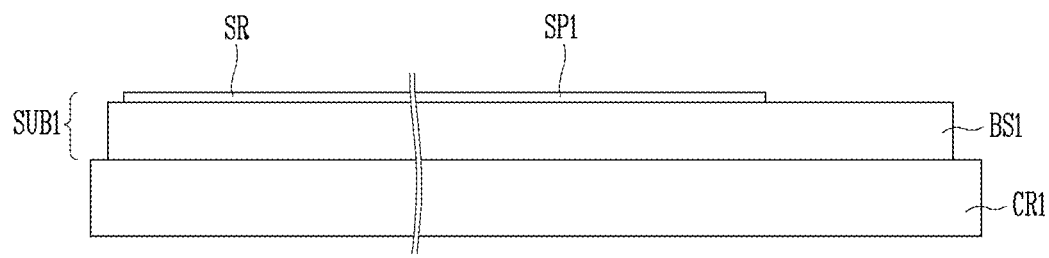
FIGS. 6A, 6B, 6C, 6D, 6E, 6F and 6G are cross sectional views sequentially illustrating a manufacturing method of a display device according to an embodiment of the present disclosure.
Figure 6B:
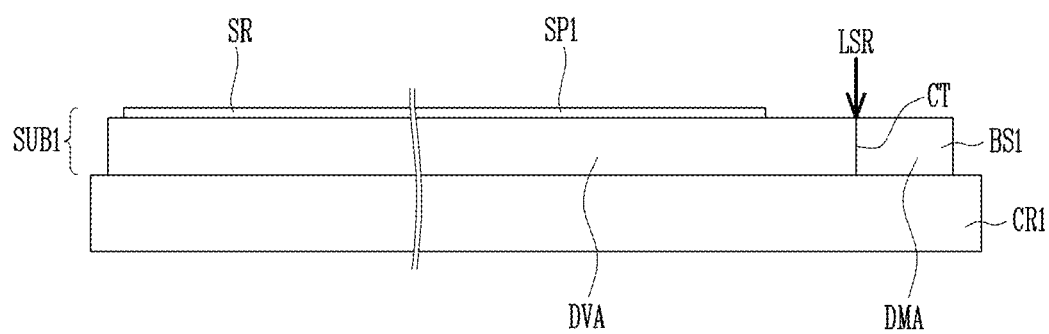
Figure 6C:
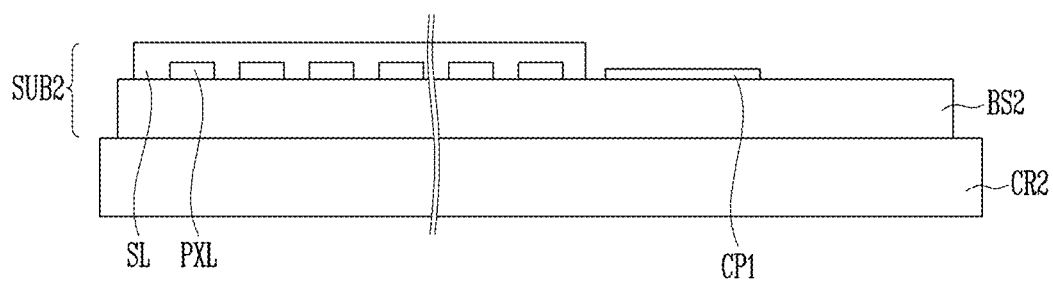
Figure 6D:
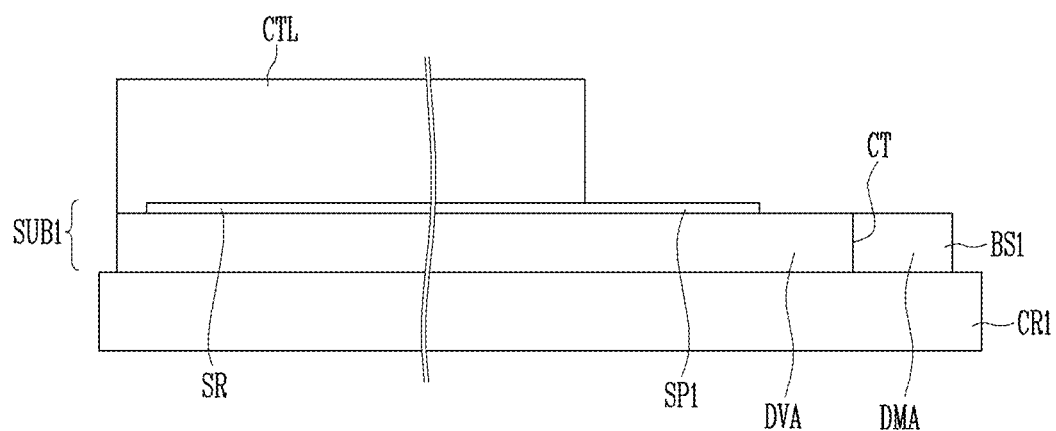
Figure 6E:
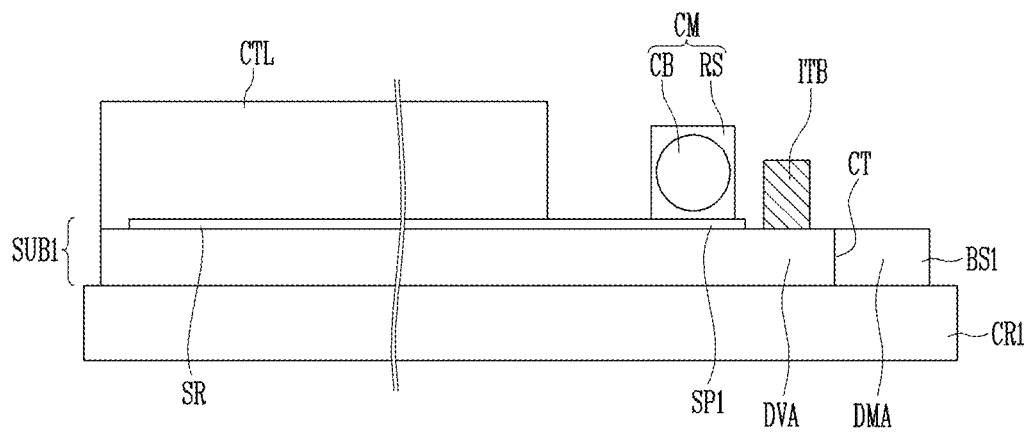
Figure 6F:
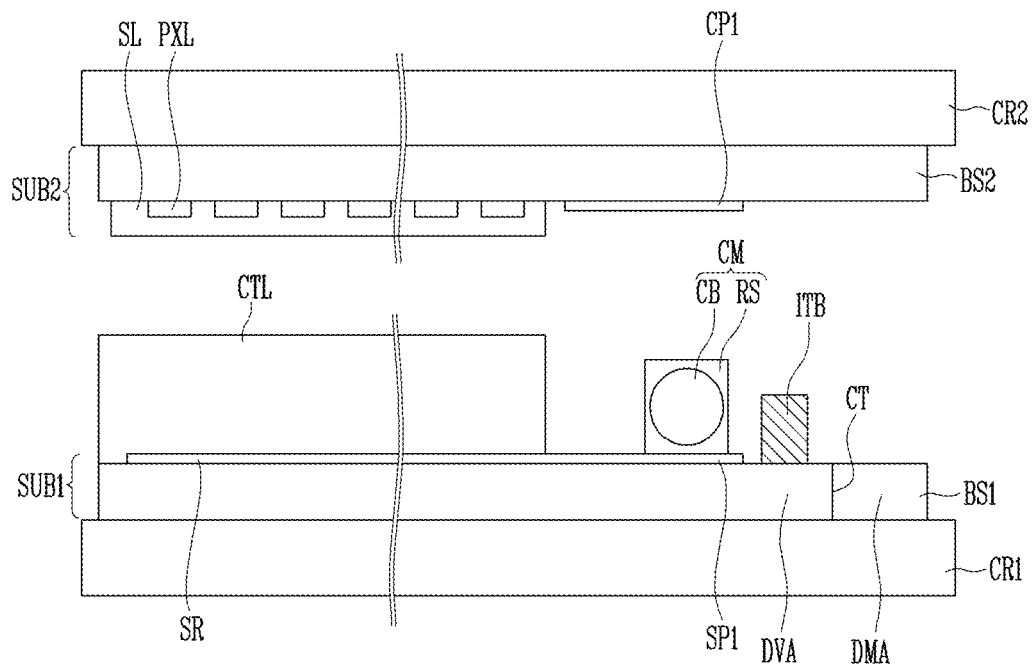
Figure 6G:
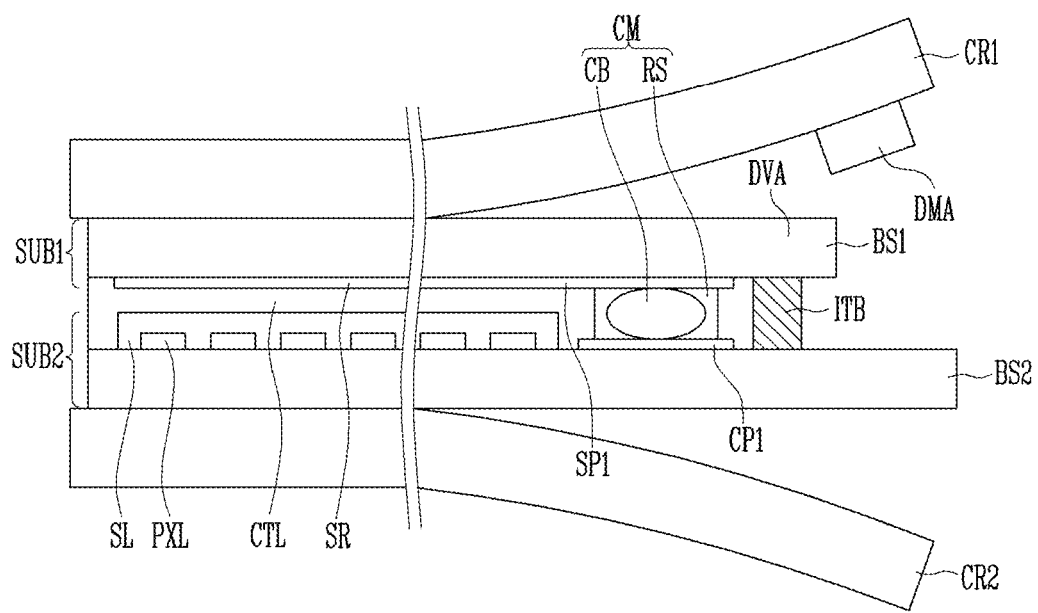

Referring to FIGS. 6B and 7, the first substrate SUB1 can be provided on the first carrier substrate CR1.

The first substrate SUB1 can include an element region DVA in which the touch sensor SR, the connecting lines CL, and the touch sensor pad part SP are formed and a dummy region DMA provided on one side of the element region DVA. The dummy region DMA can be a region to be separated and removed such that a separate configuration element can be not formed. The element region DVA can be included in a final display device after the dummy region DMA is removed.

The pre-cutting of the first substrate SUB1 can be performed between the element region DVA and the dummy region DMA bordering a cutting line CT. In the final display device, the cutting line CT can correspond to the first side S1 of the first substrate SUB1. Equally seen as a whole, the cutting line can extend in the first direction D1 same as the first side S1 of the first substrate SUB1, but be bent in the second direction D2 in some regions. Accordingly, the cutting line CT can be dented toward the side of the display area DA in a plan view.

The first substrate SUB1 can be cut in various types. According to an embodiment, the first substrate SUB1 can be cut by using laser LSR. The pre-cutting of the first substrate SUB1 can be performed to easily separate the dummy region DMA.

The first substrate SUB1 and the first carrier substrate CR1 can contact each other, and attached to each other by static electricity or Van der Waals forces. However, adhesion of the first substrate SUB1 and the first carrier substrate CR1 can mean that surfaces of the first substrate SUB1 and the first carrier substrate CR1 can be attached to each other, but does mean that the first substrate SUB1 and the first carrier substrate CR1 are in a chemical combination (for example, covalent bonds) with being separated. In addition, between the first substrate SUB1 and the first carrier substrate CR1, a separate layer, for example, an attaching layer or an adhesive layer, aside from an air layer can be not formed between the first substrate SUB1 and the carrier substrate CR1. The first substrate SUB1 and the first carrier substrate CR1 can be easily separated from each other without damage when power is supplied from the outside. Accordingly, even though the first substrate SUB1 is pre-cut, the element region DVA and the dummy region DMA of the first substrate SUB1 can be maintained to be attached to the first carrier substrate CR1.

Figure 8:
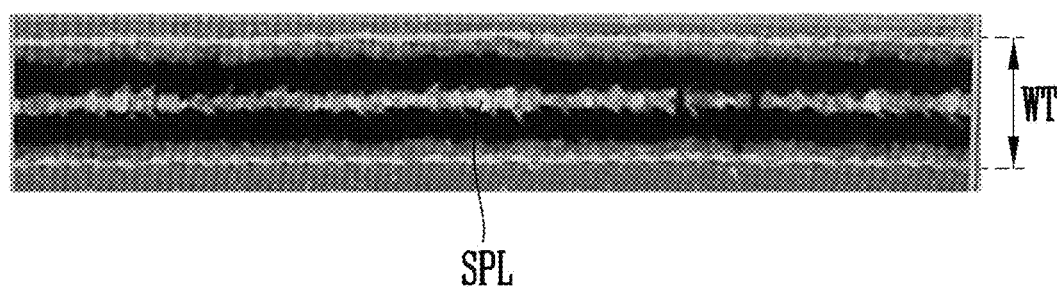
FIG. 8 is a view illustrating pre-cutting a first substrate by using laser.

FIG. 8 is a view illustrating pre-cut first substrate by using laser.

Referring to FIG. 8, when the first substrate is cut by using the first substrate, a separating line SPL can be formed along the cutting line inside of the first substrate. The separating line SPL can be a deeper and sharper than surroundings, and it is caused by an energy distribution of the laser. A density of the laser can be in accordance with Gaussian curve, and temperature of thermal energy and heat of a central part emitted by the laser can be highest. Accordingly, when cutting by using the laser, the central part of the cutting line can receive more energy and heat than the surroundings.

Referring to FIGS. 1 to 4 and 6C, the second substrate SUB2 can be manufactured. A manufacturing operation of the second substrate SUB2 can include a forming operation of the pixels PXL, the sealing layer SL, the signal lines SGL, the driving pad part OP, and the connecting pad part CP on the second base substrate BS2. To effectively form the pixels PXL on the second base substrate BS2, the second carrier substrate CR2 which supports the second base substrate BS2 can be provided in the lower part of the second base substrate BS2.

The second substrate SUB2 and the second carrier substrate CR2 can contact each other, and be attached to each other by static electricity or van der Waals forces.

The pixels PXL can be formed by various processes, for example, by using photolithography in a plurality of times.

Referring to FIGS. 1 to 4 and 6D, the interlayer CTL can be provided on at least one of the first substrate SUB1 and the second substrate SUB2. According to an embodiment, the interlayer CTL can be formed on the first substrate SUB1, but on the second substrate SUB2 in another embodiment.

In addition, the interlayer CTL can be formed on the first substrate SUB1 by various methods, for example, one of a printing method, a coating method and a dispensing method. For example, the interlayer CTL can be formed by at least one of a printing method such as a screen printing, an inkjet printing and a nozzle printing, a coating method such as a slit coating, a spin coating and a spray coating, or dispensing method using the dispenser. According to an embodiment, when the interlayer is formed by the screen printing method, the interlayer can be formed by printing in a surface shape.

According to an embodiment, the interlayer CTL can be provided in the display area DA of the first substrate SUB1 in an uncured state. In a plan view, the region in which the interlayer CTL is formed does not correspond to the display area DA. And the intermediate layer (CTL) in the curing process of the formation of the intermediate layer (CTL) can spread out, in view of the above parts, the interlayer CTL can be formed.

The intermediate layer (CTL) is semi-cured. The SEMI-cured process is performed to have a proper degree of flexibility and elasticity of the intermediate layer (CTL). The process can be formed by the thermosetting or UV curing.

Referring to FIGS. 1 to 4 and 6E, the conductive member CM and the inter-bar ITB can be formed in the non-display area NDA of the first substrate SUB1 in which the interlayer CTL is formed. According to an embodiment, the conductive member CM and the inter-bar ITB can be formed on the first substrate SUB1, but it not limited thereto. When the interlayer CTL is formed on the first substrate SUB2, the conductive member CM and the inter-bar ITB can be formed on the second substrate SUB2. Sequencing of the conductive member CM and the inter-bar ITB is not limited but performed simultaneously.

The conductive member CM can be formed on the touch sensor pad part SP. According to an embodiment, the conductive member CM can be formed by applying the insulating material RS including having a predetermined degree of flexibility by being uncured or half-cured with the conductive balls to the first substrate SUB1. The conductive member CM can be formed by the screen printing method or the dispensing method using the dispenser. According to an embodiment, when the conductive member CM is formed by using the dispenser, the conductive member CM can be formed by a method of discharging the insulating material RS including the conductive balls CB while moving the dispenser along an imaginary line of the touch sensor pad part SP.

Figure 9A:
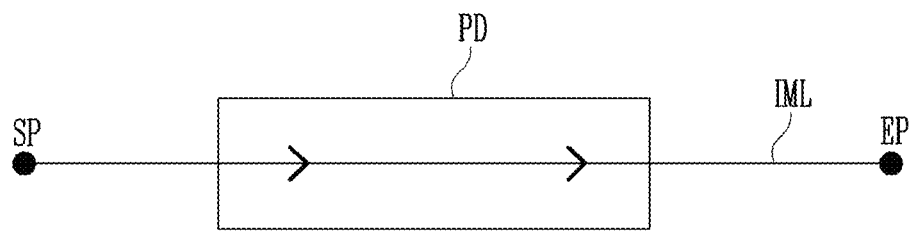
FIGS. 9A, 9B and 9C are schematic views illustrating embodiments in which a conductive member is applied by using a dispenser.
Figure 9B:
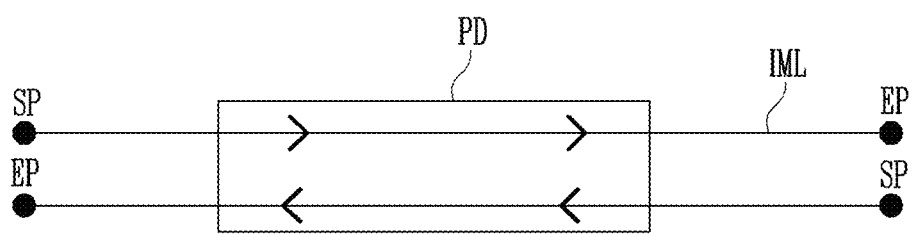
Figure 9C:
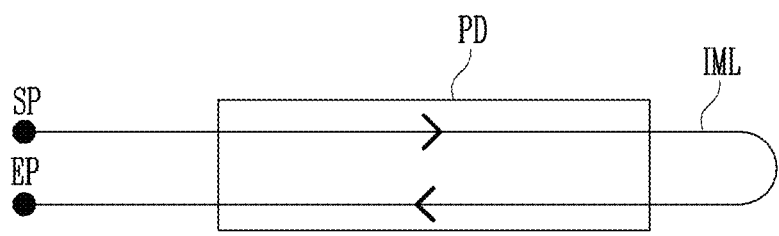

FIGS. 9A to 9C are schematic views illustrating a conductive member is applied by using a dispenser.

Referring to 9a to 9c, material of the conductive member, that is, the insulator including the conductive balls (for example, the touch sensor pad part or the connecting pad part) can be applied to a corresponding region in which the pad part is arranged. The material can be discharged on the first substrate SUB1 or the second substrate SUB2 through a nozzle of the dispenser which moves along a predetermined imaginary line IML. In the imaginary line IML, when an end portion in which the material starts to discharging is a starting point SP, and a point in which the material stops discharging is an end point EP, the material can overlap the imaginary line IML, and constitute a line having the starting point SP and the end point EP. When applying the material, in a plan view, a length of the conductive member can be formed greater than a length of the pad part PD. In some embodiments, the starting point SP and the end point EP do not overlap the pad part PD. That is, the starting point SP and the end point EP can be situated at the outside of the pad part PD.

Since the material is fluid, the material can be spread along the lines in a direction perpendicular to the direction in which the lines are applied, and include a predetermined width which covers the pad part PD accordingly.

The imaginary IML can be provided in a single body or in a plurality of layers. In addition, the imaginary IML can be provided in various shapes, for example, in straight lines or in the curves. The number of imaginary lines and shapes of imaginary lines can be selected in accordance with an area or a shape of the touch sensor pad part and viscosity or liquidity of the material. For the reference, FIG. 9A illustrates a single imaginary line IML, FIG. 9B illustrates two imaginary lines IML, and FIG. 9C illustrates a single imaginary line including a turning poring which switches an applying direction.

Since the material have a predetermined degree of viscosity, discharge amount at the starting point, discharge amount at the end point, discharge amount at the turning point, and discharge amount between the starting point SP and the end point EP can be different from one another. Specifically, the discharge amount at the starting point, the discharge amount at the end point and the discharge amount at the turning poring can be larger than the discharge amount of interval sections. Accordingly, when the material is applied, in the case that the starting point SP, the end point EP and the turning point exist in the pad part PD, the discharge amount at the starting point SP, at the end point EP and at turning point are large enough, a contact of the conductive balls can be blocked, and the material can be not applied evenly to the pad part PD, so that it causes the contact error of the conductive member. According to an embodiment, the dispenser can move along the imaginary line IML, but the starting point SP, the end point EP and the turning point do not overlap the pad part PD. Accordingly, the material can be not evenly applied to the pad part PD.

Referring to FIGS. 1 to 4 and 6E, in the conductive member CM, the diameter of each conductive ball CB can vary in accordance with a gap between the first substrate SUB1 and the second substrate SUB2 to be electrically connected to each other. According to an embodiment, each conductive ball CB provided on the first substrate SUB1 can substantially have a spherical shape, and the diameter thereof is from 16 24 micrometer to 24 micrometer.

The inter-bar ITB can be formed to be adjacent to the touch sensor pad part SP. The inter-bar ITB can be formed between the touch sensor pad part SP and the cutting line CT.

The inter-bar ITB can be formed along the cutting line CT between the display area DA of the first substrate SUB1 and the cutting line CT corresponding to the first side S1 of the first substrate SUB1. The inter-bar ITB can be not formed on the second, third and fourth sides S2, S3 and S4.

The inter-bar ITB can be formed to prevent the interlayer CTL from moving in a direction of the touch sensor pad part SP when interlayer CTL is cured. In addition, the inter-bar ITB can be formed to enforce the adhesive between the first substrate SUB1 and the second substrate SUB2.

The inter-bar ITB can be formed by applying the insulating material having predetermined liquidity not-cured or semi-cured to the first substrate ITB1. The inter-bar ITB can be formed by the screen printing method or the dispensing method using the dispenser. According to an embodiment, when the inter-bar ITB is formed by the screen printing method, the inter-bar ITB can be formed by printing the insulator RS in a line shape. According to an embodiment, when the inter-bar ITB is formed by the dispensing method, the inter-bar ITB can be formed by a method of discharging the insulator RS by moving the dispense from the second side S2 to the fourth side S4 or to the opposite side, along the first direction D1.

According to an embodiment, a height H1 of the inter-bar ITB can be smaller than a diameter of each conductive ball CB so that the interlayer is prevented to be overflown and improve the adhesive between the first substrate SUB1 and the second substrate SUB2.

Referring to FIGS. 1 to 4 and 6F, the first substrate SUB1 and the second substrate SUB2 can be bonded to each other interposed among the interlayer CTL, the inter-bar ITB, and the conductive member CM.

In the bonding process, the first substrate SUB1 and the second substrate SUB2 can be compressed in the opposing direction (In the drawings, an up-down direction.) Compressing the first substrate SUB1 and the second substrate SUB2 can be performed from the upper direction to the down direction, that is, in a way of pressing in the direction from the second substrate SUB2 to the first substrate SUB1.

According to an embodiment, when the interlayer CTL, the inter-bar IBT1, and the conductive member CM are formed on the second substrate SUB2, the first substrate SUB1 can be above the second substrates, and the pressure can be compressed from the first substrate SUB1 to the second substrate SUB2.

According to an embodiment, by the compression above, a surface of the first substrate SUB1 can contact an upper face of the inter-bar ITB. The interlayer CTL, the inter-bar ITB, and the conductive member CM can have the predetermined liquidity or and elasticity since interlayer CTL, the inter-bar ITB, and the conductive member CM can be formed of uncured or semi-cured material. Accordingly, when the pressure is applied from the outside, the pressure can be applied until the surface of the first substrate SUB1 can contact the spacer in the inter-bar ITB. Due to the spacer, it is prevented that the surface of the first substrate SUB1 directly contacts the surface of the second substrate SUB2.

When the pressure is removed, volume can be restored by the elasticity of the interlayer CTL, the inter-bar ITB, and the conductive member CM. The interlayer CTL, the inter-bar ITB, and the conductive member CM can be restored to achieve the volume in which external atmospheric pressure and the elasticity of the interlayer CTL, the inter-bar ITB, and the conductive member CM make the balance of power.

In addition, since the first substrate SUB1 and the second substrate SUB2 are compressed in the un-down direction, the conductive balls CB between the touch sensor pad part SP and the connecting pad part CP can be modified in the oval shape. A gap between the touch sensor pad part SP and the connecting pad part CP can be energized by the conductive balls CB.

The interlayer CTL, the inter-bar ITB, and the conductive member CM can be cured when the first substrate SUB1 and the second substrate SUB2 are bonded to each other across the interlayer CTL, the inter-bar ITB, and the conductive member CM. The curing process can be performed by the thermosetting using the heat or by the UV curable using the light such as UV.

In the curing process, the interlayer CTL, the inter-bar ITB, and the conductive member CM can be thoroughly cured, the first substrate SUB1 and the second substrate SUB2 can be firmly attached to each other. The interlayer CTL can be spread out in a region during the curing process. When the interlayer CTL is spread to the driving pad part OP, the driving pad part OP can be contaminated by the spread interlayer CTL, and the contact error can occur when connected to the flexible printed circuit substrate. However, the interlayer CTL can be blocked to spread out by the inter-bar ITB, a third inter bar ITB3 in particular, so that the interlayer CTL is not spread out to the driving pad part OP and the contact error can be prevented.

In the curing process, the interlayer CTL, the inter-bar ITB, and the conductive member CM can be thoroughly cured, the first substrate SUB1 and the second substrate SUB2 can be firmly attached to each other.

A manufacturer display device can be reversed.

Referring to FIGS. 1 to 4 and 6E, the first carrier substrate CR1 and the second carrier substrate CR2 can be removed. That is, the first carrier substrate CR1 can be separated from the first substrate SUB1 and the second carrier substrate CR2 can be separated from the second substrate SUB2.

When the first carrier substrate CR1 is removed, the dummy region DMA, among the pre-cut portions of the first substrate SUB2 can be removed while attached to the first carrier substrate CR1.

When the first carrier substrate CR1 is separated from the first substrate SUB1 and the second carrier substrate CR2 is separated from the second substrate SUB2, a stress can be applied outwards to each of the first substrate SUB1 and the second substrate SUB2. However, since the inter-bar ITB is provided between the first substrate SUB1 and the second substrate SUB2, it prevents separations between the conductive member CM and the first substrate SUB1 by the stress, and between the conductive member CM and the second substrate SUB2. Specifically, a stress when separating the first and second carrier substrate CR1 and CR2 and the first and second substrates SUB1 and SUB2 can be greatly applied the conductive member CM arranged adjacent to the first side S1 of the first substrate SUB1, but the contact error between the conductive member CM and the pad part can be prevented since the gaps between two substrates are firmly attached by the inter-bar ITB.

Figure 10A:
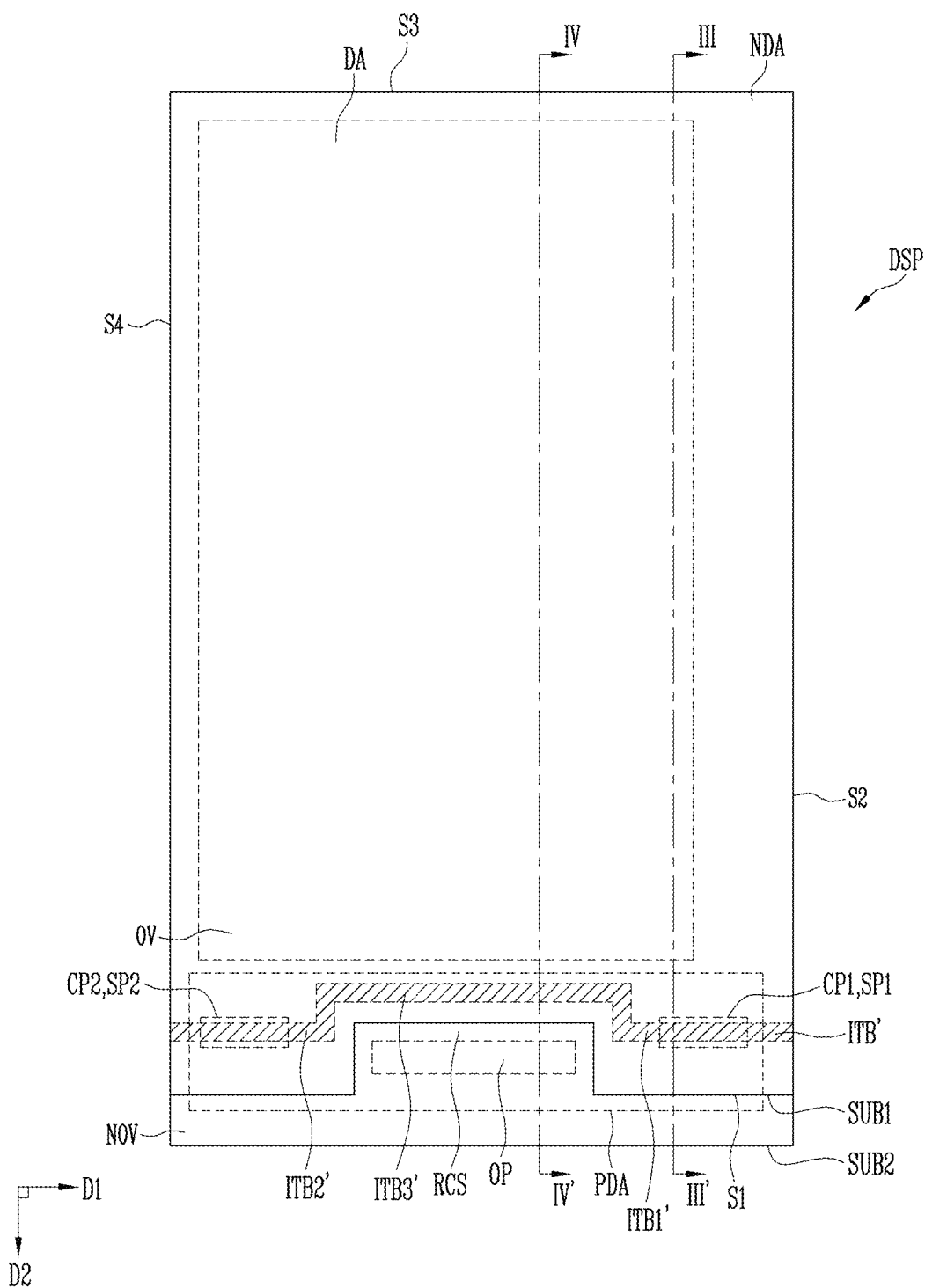
FIG. 10A is a plan view illustrating a display device according to another embodiment of the present disclosure.
Figure 10B:
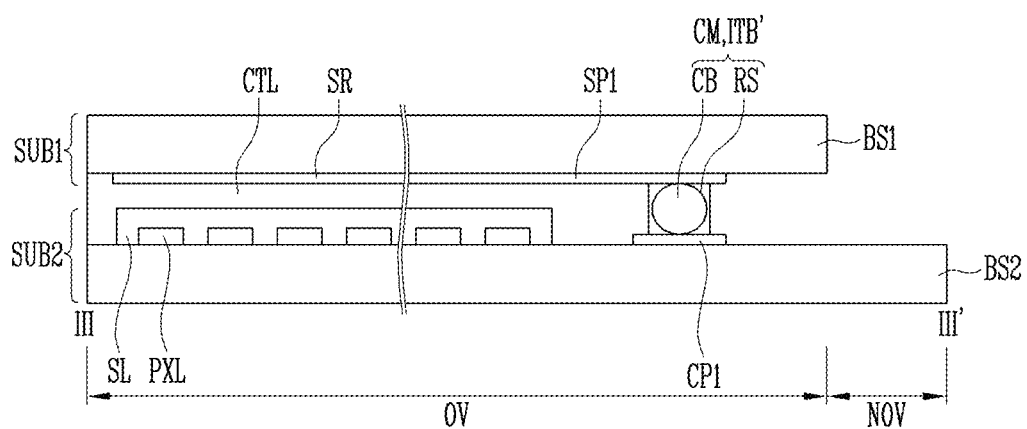
FIG. 10B is a cross sectional view taken along line III-III' of FIG. 10A.

FIG. 10A is a plan view illustrating a display device according to another embodiment. FIG. 10B is a cross sectional view taken along line III-III' of FIG. 10A, and FIG. 10C is a cross sectional view taken along line IV-IV' of FIG. 10A.

Hereafter, according to another embodiment, a different point will be described to avoid duplicate description.

Figure 10C:
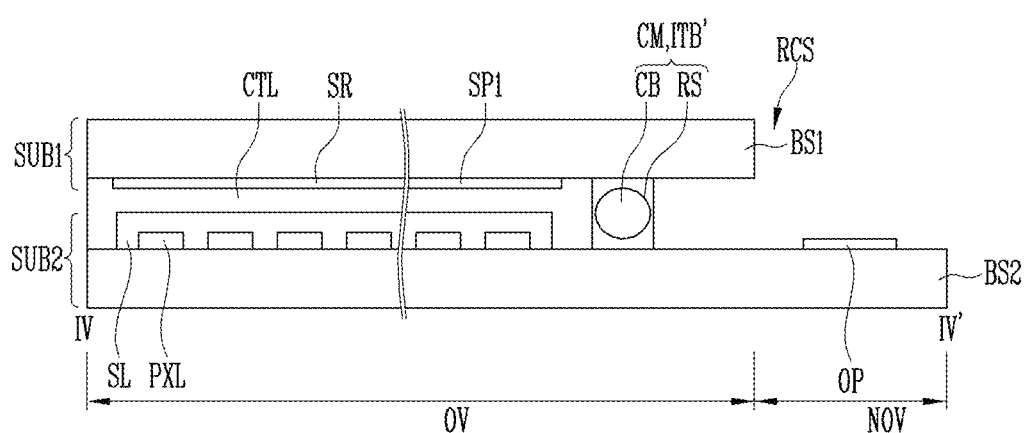
FIG. 10C is a cross sectional view taken along line IV-IV' of FIG. 10A.

Referring to FIGS. 10A to 10C, in another embodiment, the inter-bar ITB' can be integrated with the conductive member CM. According to an embodiment described above, the conductive member and the interlayer can be provided as separated elements which are spaced apart from each other. According to the present embodiment, the conductive member and the inter-bar ITB' can be provided as a single body.

The inter-bar ITB' can include a plurality of conductive ball CB and the insulator RS surrounding the plurality of conductive ball CB. Since the conductive balls CB and the insulator RS are already described, the explanation will be omitted.

According to the present embodiment, in a plan view, the inter-bar ITB' can be provided in the non-display area NDA between the first substrate SUB1 and the second substrate SUB2. According to the present embodiment, the inter-bar ITB' can be not provided on the second to fourth sides S2, S3 and S4, but provided on the first side S1 of the first substrate SUB1.

According to the present embodiment, in a plan view, the inter-bar ITB' can pass through touch sensor pad part SP and the connecting pad part CP, and overlap touch sensor pad part SP and the connecting pad part CP, respectively. The inter-bar ITB' can extend along an edge of the first side S1 of the first substrate SUB1 in areas other than the area in which the touch sensor pad part SP and the connecting pad part CP are formed. The inter-bar ITB' can be formed to have a similar shape along a shape of the first side S1 of the first substrate SUB1. That is, in a plan view, the first side S1 of the first substrate SUB1 can be bent more than once, and include a portion extend in the first direction D1 and a portion extend in the second direction D2, in a plan view, the inter-bar ITB' can be bent more than once, and include the portion extend in the first direction D1 and the portion extend in the second direction D2. The first side S1 of the first substrate SUB1 and the shape of the inter-bar ITB' can have the similar shape although there are some differences in length.

The inter-bar ITB' can include the first and second inter-bars ITB1' and ITB2' spaced apart from each other corresponding to the first and second touch sensor pad parts SP1 and SP2, and the third inter-bar ITB3' provided between the first and second substrates ITB1' and ITB2'. In a plan view, the third inter-bar ITB3' can be a region bent from the first and second inter-bars ITB1' and ITB2' to the display area DA direction. The third inter-bar ITB3' can be provided between the first touch sensor pad part SP1 and the second touch sensor unit SP2 on the first direction D1 basis, and provided between the display area DA and the driving pad part DP on the second direction D2 basis.

An upper surface of the first and second inter-bars ITB1' and ITB2' can contact the touch sensor pad part SP and a lower surface of the first and second inter-bars ITB1' and ITB2' can contact the connecting pad part CP in a region in which the touch sensor pad part SP and the connecting pad part CP are provided. In more detail, the conductive balls CB in the first and second inter-bars ITB1' and ITB2' can directly contact the touch sensor pad part SP and the connecting pad part CP. By the conductive balls CB, the touch sensor pad part SP can be electrically connected to the connecting pad part CP.

The first to third inter-bars ITB1', ITB2' and ITB3' can be provided in a single body without being separated. That is, the first to third inter-bars ITB1', ITB2' and ITB3' can be formed in a straight line. According to an embodiment, one end portion of the inter-bar ITB' can meet the fourth side S4 and another end portion of the inter-bar ITB' can meet the second side S2.

The inter-bar ITB' can extend to a region excluding a region in which the touch sensor pad part SP and the connecting pad part CP are provided, and bond the gap between the first substrate SUB1 and the second substrate SUB2. As a result, the first conductive member CM can be prevented from being separated from the first substrate SUB1 and the second substrate SUB2.

Figure 11A:
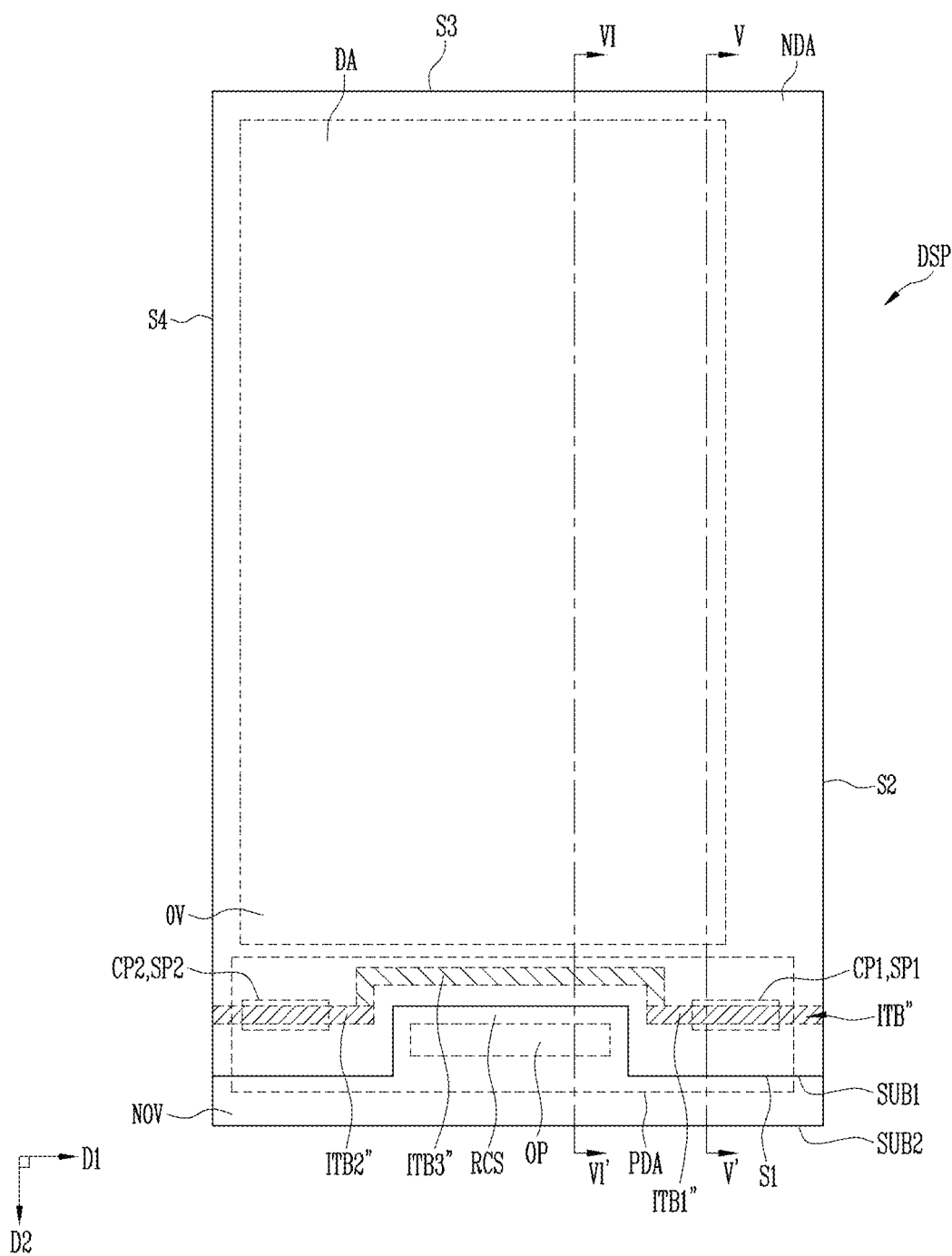
FIG. 11A is a plan view illustrating a display device according to another embodiment of the present disclosure.
Figure 11B:
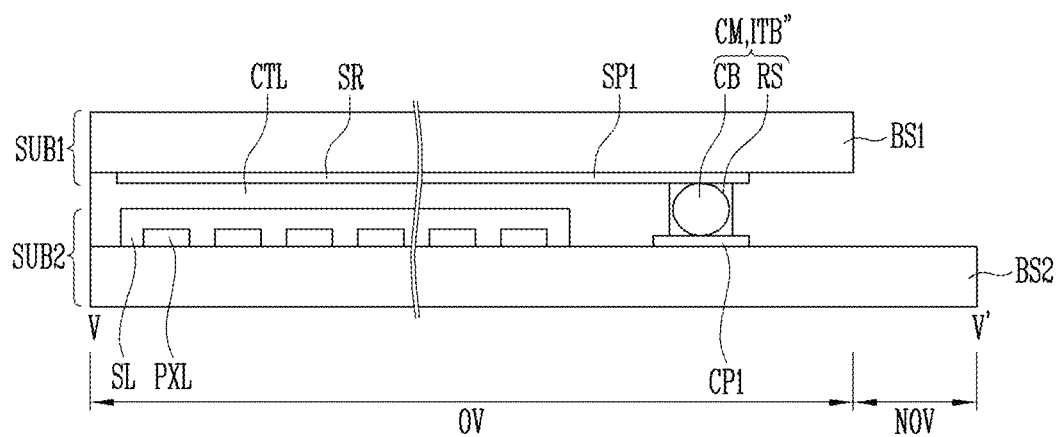
FIG. 11B is a cross sectional view taken along line V-V' of FIG. 11A.
Figure 11C:
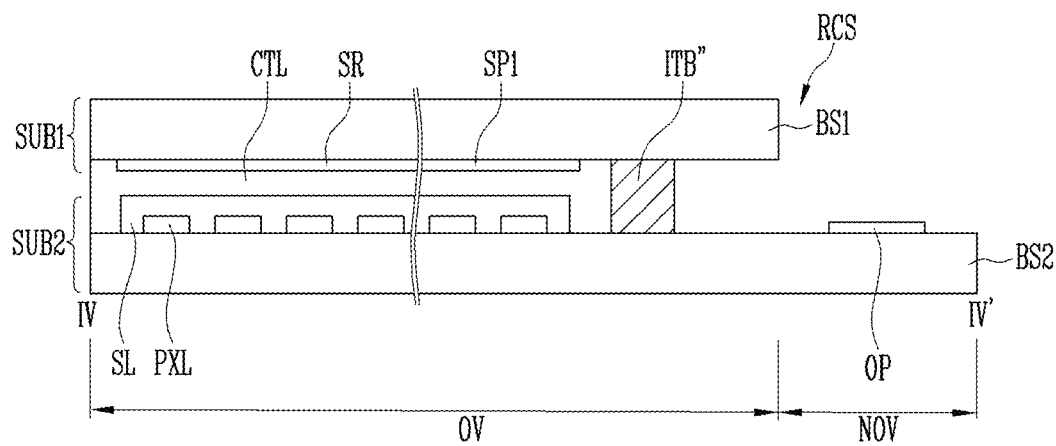
FIG. 11C is a cross sectional view taken along line VI-VI' of FIG. 11A.

FIG. 11A is a plan view illustrating a display device according to another embodiment, FIG. 11B is a cross sectional view taken along line V-V', and FIG. 11C is a cross sectional view taken along line VI-VI' of FIG. 11A.

Referring to FIGS. 11A to 11C, according to another embodiment, the inter-bar ITB" can be formed by using more than one type of material.

The inter-bar ITB' can include the first and second inter-bars ITB1" and ITB2" spaced apart from each other corresponding to the first and second touch sensor pad parts SP1 and SP2, and third inter-bar ITB3" provided between the first and second inter-bars ITB1" and ITB2".

The first and second inter-bars ITB1" and ITB2" are formed of conductive materials and the upper surface of the first and second inter-bars ITB1' and ITB2' can contact the touch sensor pad part SP and the lower surface of the first and second inter-bars ITB1' and ITB2' can contact the connecting pad part CP in the region in which the touch sensor pad part SP and the connecting pad part CP are provided. Accordingly, the touch sensor pad part SP can be electrically connected to the connecting pad part CP, and the first and second inter-bars ITB1' and ITB2 can operate as the conductive member CM in another embodiment. The first and second inter-bars ITB1' and ITB2 can include the conductive balls CB and the insulator RS to have conductivity.

The third inter-bar ITB3" can be provided in a region in which the touch sensor pad part SP and the connecting pad part CP are not provided, and it is not required to have the conductivity. Accordingly, third inter-bar ITB3" can be formed of the insulating material which does not have the conductive balls, for example, the insulator RS.

According to an embodiment, it is illustrated that the first and second inter-bars ITB1" and ITB2" are formed of the conductive material, and the third inter-bar ITB3" is formed of the non-conductive material, but it not limited thereto. In the first and second inter-bars ITB1" and ITB2", a portion overlapping the touch sensor pad part SP and the connecting pad part CP can be formed of the conductive material, and the remaining portion can be not formed of the conductive material.

Since the first and second inter-bars ITB1" and ITB2" are applied by using the dispenser, in the process of forming the first and second inter-bars ITB1" and ITB2", when applying the material of the conductive member, the starting point, the end point, and the turning point do not overlap the touch sensor pad part SP. That is, the starting point, the end point, and the turning point can be situated at the outside of the touch sensor pad part SP, and uniformity of the material of the conductive member in the touch sensor pad part SP can be improved accordingly.

Figure 12:
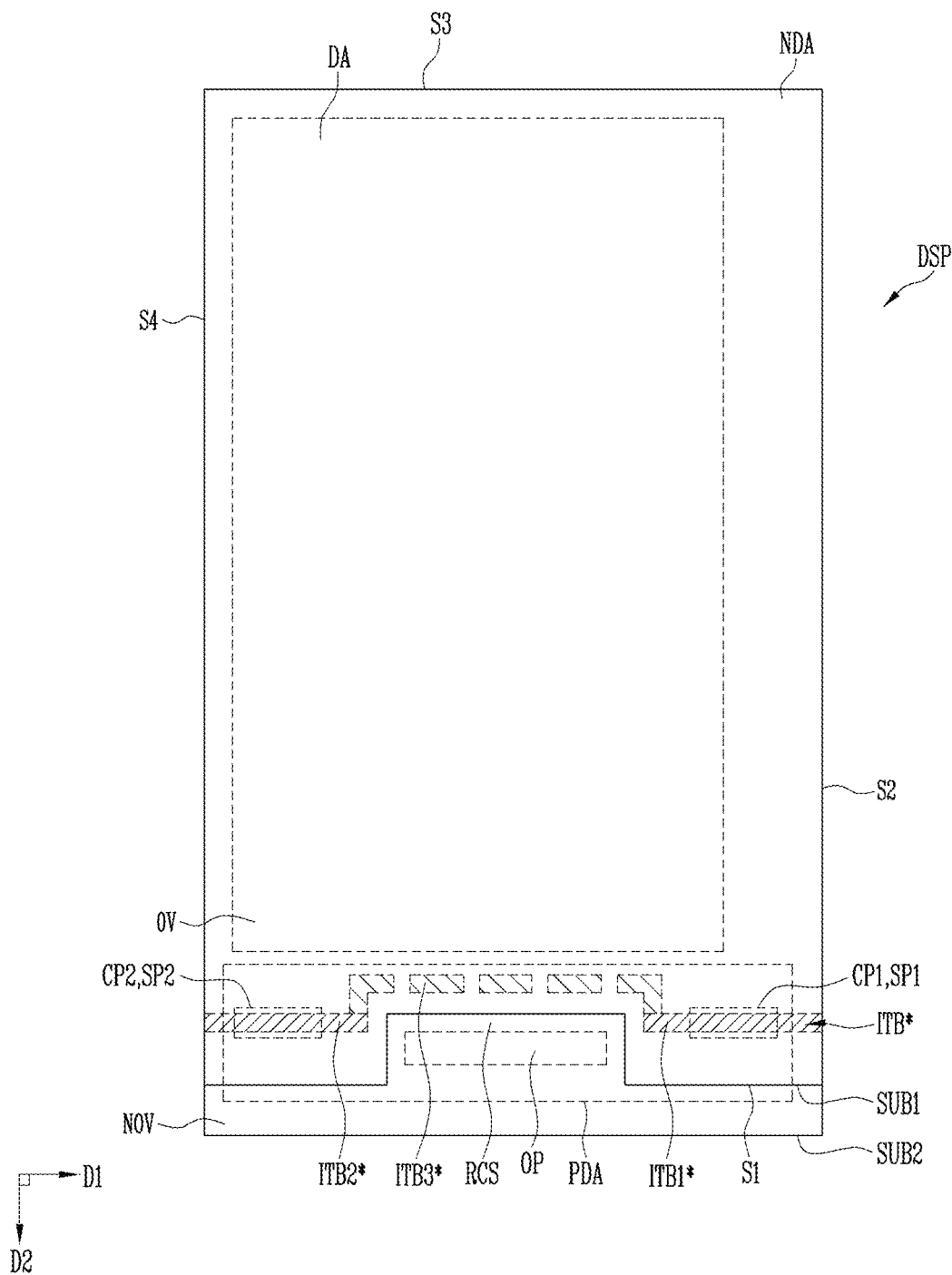
FIG. 12 is a plan view illustrating a display device according to another embodiment of the present disclosure.

FIG. 12 is a plan view illustrating a display device according to another embodiment.

Referring to FIG. 12, the inter-bar ITB* can be separated into in a plurality of regions. For example, the inter-bar layer ITB* can include the first and second inter-bars ITB1* and ITB2* spaced apart from each other corresponding to the first and second touch sensor pad parts SP1 and SP2 and the third inter-bar ITB3* provided between the first and second inter-bars ITB1* and ITB2*. According to the present embodiment, considering the arrangement of other configuration elements, at least one of the first, second and third inter-bars ITB1*, ITB2* and ITB3* can be separated into a plurality of portions. In FIG. 12, the third inter-bar ITB3* is illustrated to be separated into 5 (five) portions and spaced apart from each other, but the first and second inter-bars ITB1* and ITB2* can be separated into the plurality of portions.

Figure 13A:
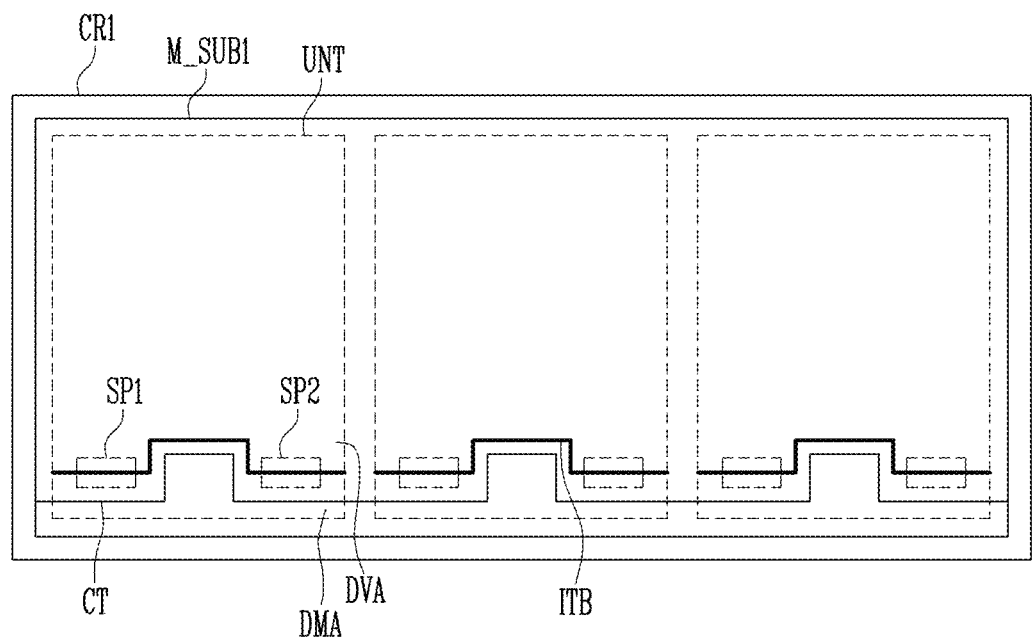
FIGS. 13A and 13B are plan views illustrating a method of manufacturing of a plurality of first substrates simultaneously according to an embodiment of the present disclosure.
Figure 13B:
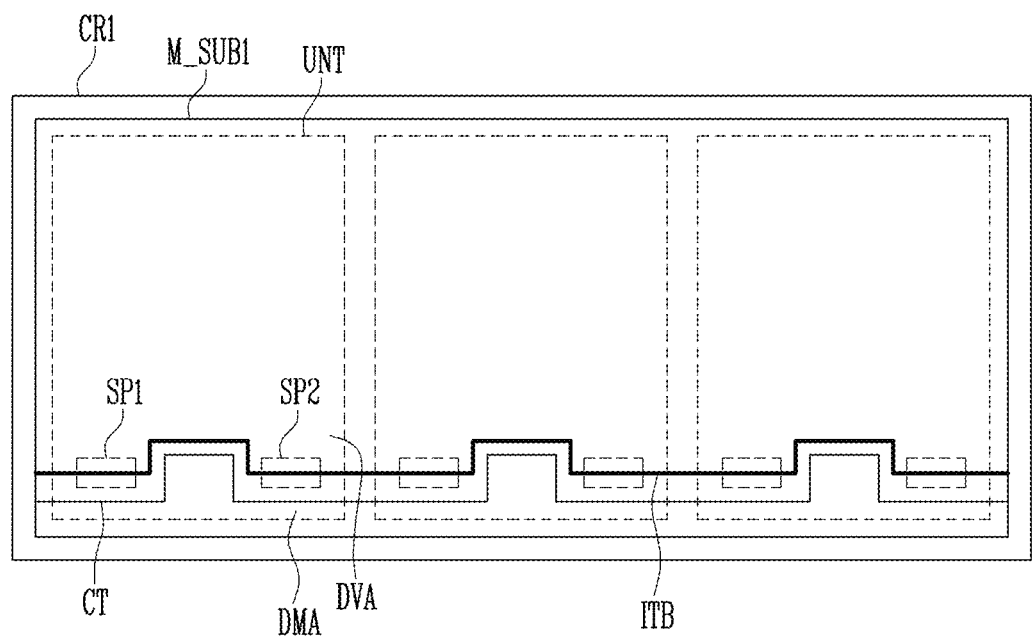

In a manufacturing method according to an embodiment, each of the display devices can be formed but a plurality of display device can be formed simultaneously. FIGS. 13A and 13B are plan views illustrating a method of manufacturing a plurality of first substrates simultaneously according to an embodiment. According to the present embodiment, some differences can exist in that the plurality of display devices are formed in a large mother substrate simultaneously, but the configuration element formed on the mother substrate can be substantially same as the configuration element of each display device, for convenience of explanation, a method of forming the plurality of display devices will be explained by describing the first mother substrate in which some components are shown.

According to an embodiment, a first mother substrate M_SUB1 and a second mother substrate (not shown) are prepared. The first carrier substrate CR1 can be provided on a back side of the first mother substrate M_SUB1 to support the first substrate M_SUB1. The second carrier substrate (not shown) can be provided on a back side of the second mother substrate to support the second substrate.

The first mother substrate M_SUB1 can include a plurality of first unit regions UNT. The first unit region UNT can correspond to the first substrate of each display device, and the first substrate of each display device can be formed in each unit region UNT. The first mother substrate M_SUB1 can be cut along the first unit region UNT, and the plurality of first substrate can be formed at a time accordingly.

The touch sensor, the connecting lines, and the touch sensor pad part can be formed in the first unit region UNT on the first mother substrate M_SUB1. The touch sensor pad part can include the first and second touch sensor pad parts SP1 and SP2. A method of forming the touch sensor, the connecting lines, and the touch sensor pad part is substantially same as the above.

The second mother substrate can include a plurality of second unit regions (not shown) in the same manner of the first mother substrate M_SUB1. The second unit region of the second mother substrate can correspond to the second substrate of each display device, and the second substrate of each display device can be formed in each second unit region. That is, a pixel, a sealing layer, signal lies, and a driving pad part provided in an end portion of the signal lines, and a connecting pad part corresponding to the touch sensor pad part can be formed in each second unit region of the second mother substrate.

A portion of the first mother substrate M_SUB1 in which the touch sensor and the like are formed can be pre-cut. In more detail, a portion of the non-display area of each first unit region UNT can be pre-cut along the cutting line CT. The cutting line CT can divide the first unit region UNT into the element region DVA and the dummy region DMA. Only the first unit region UNT can be pre-cut but pre-cutting can be performed between the first unit regions UNT adjacent to one another.

The interlayer and the inter-bar ITB can be formed on the pre-cut first mother substrate M_SUB1. The inter-bar ITB can extend along the cutting line CT, in a plan view, the inter-bar ITB can pass through the first and second touch sensor pad parts SP1 and SP2. Since the inter-bar ITB is formed by using the dispenser, an imaginary line of which the dispenser moves can extend along the cutting line CT, and the starting point and the end point when applying the material of the inter-bar ITB can be arranged at the outside of each of the first and second touch sensor pad parts SP1 and SP2. Specifically, referring to FIG. 13A, when forming the inter-bar ITB, the starting point and the end point can be situated on two sides of the first unit region UNT. In addition, referring to FIG. 13A, when forming the inter-bar ITB, the starting point and the end point can be situated on one side and another side of the first mother substrate M_SUB1, and inter-bar ITB can extend to the between first unit regions UNT adjacent to each other and formed at a time.

The first mother substrate M_SUB1 can be attached to the second mother substrate. The first unit regions UNT and the second unit regions can be arranged to be opposite to each other, so that the first mother substrate M_SUB1 can be attached to the second mother substrate.

The first and second carrier substrates CR1 and CR2 can be removed. When the first carrier substrate CR1 is removed, the dummy region DMA, among the pre-cut portions of the first mother substrate M_SUB1 can be removed while attached to the first carried substrate CR1.

Forming the each display device can be completed by cutting the first mother substrate M_SUB1 and the second mother substrate along the first unit region UNT and the second unit region.

The display device including the above structure and manufactured by the method described above has the following advantages additionally. Forming the inter-bar can prevent the interlayer from being expanded to the configuration element of the non-display area, for example, the driving pad part or a detecting pad part, and the contact error in the pad part can be prevented accordingly. In addition, since it is not required to form a separate structure of the interlayer to prevent expanding, the process can become simplified and the expense can be reduced. Further, the inter-bar can support the conductive member so that it can be firmly fixed between the first substrate and the second substrate. Accordingly, the contact error of the pad part between the first substrate and the second substrate can be prevented. Moreover, since the first and second substrates are firmly bonded, both sides of the first and second base substrates can be etched after bonding the first and second substrates. By etching both sides of the first and second base substrates, a super-slim display device can be embodied.

According to at least one of the disclosed embodiments, the described technology provides a display device with decreased defects and a manufacturing method of the display device.

Embodiments are provided to more sincerely and fully disclose the inventive technology and to completely transfer the spirit of the invention to those skilled in the art to which the invention pertains, and the scope of the invention should be understood by the claims of the invention. Accordingly, it will be understood by those of skill in the art that various changes in form and details can be made without departing from the spirit and scope of the invention as set forth in the following claims. Therefore, the technical range of the present invention is not limited to the detailed description of the specification but defined by the range of the claims.

What is claimed is:

1. A display device comprising:
a display area configured to display an image;
a non-display area adjacent to the display area;
a first substrate having a first side and including a touch sensor in the display area and a touch sensor pad in the non-display area;
a second substrate opposite to the first substrate, the second substrate including a pixel in the display area and a connecting pad in the non-display area;
an interlayer in the display area and the non-display area between the first and second substrates;
a conductive member configured to electrically connect the touch sensor pad and the connecting pad; and
an inter-bar interposed between the first and second substrates and between the first side of the first substrate and the touch sensor pad, the inter-bar being on one side of the interlayer adjacent to the first side.

2. The display device claim 1, wherein the second substrate has a first side, and wherein the first side of the first substrate has a different shape from the first side of the second substrate positioned below the first side of the first substrate.

3. The display device of claim 2, wherein the first side of the first substrate has a recess, and wherein the inter-bar extends along at least a portion of the first side of the first substrate.

4. The display device of claim 1, wherein the first substrate has the first side and second to fourth sides that form a rectangular shape, and wherein the non-display area includes a pad area between the first side and the display area.

5. The display device of claim 4, wherein the inter-bar has an inseparable single body.

6. The display device of claim 4, wherein the inter-bar includes a plurality of inter-bars, and wherein adjacent inter-bars are spaced apart from each other.

7. The display device of claim 4, wherein the first side is bent more than once.

8. The display device of claim 4, wherein the inter-bar has two end portions that respectively contact the first and fourth sides of the first substrate.

9. The display device of claim 4, wherein the second substrate has a surface area that is larger than that of the first substrate, wherein the second substrate includes a non-overlapping portion that does not overlap the first substrate, and wherein a portion of the pad area is at least partially provided in the non-overlapping portion.

10. The display device of claim 9, further comprising a driving pad in the non-overlapping portion of the second substrate.

11. The display device of claim 4, wherein the inter-bar is provided between the touch sensor pad and the first side.

12. The display device of claim 11, wherein the connecting pad includes a first connecting pad and a second connecting pad spaced apart from each other.

13. The display device of claim 12, wherein the inter-bar includes:

a first inter-bar and a second inter-bar spaced apart from each other and respectively adjacent to the first and second connecting pad, and
a third inter-bar between the first and second inter-bars.

14. The display device of claim 13, wherein the third inter-bar includes a bent portion extending in a direction from the first and second inter-bars to the display area.

15. The display device of claim 13, further comprising a driving pad between the first and second connecting pad.

16. The display device of claim 15, wherein the third inter-bar is provided between the display area and the driving pad.

17. The display device of claim 4, wherein the conductive member is integrally formed with at least a portion of the inter-bar in an inseparable body.

18. The display device of claim 17, wherein at least the portion of the inter-bar comprises a plurality of conductive balls and an insulator surrounding the conductive balls.

19. The display device of claim 18, wherein the inter-bar includes the conductive balls and the insulator in a region in which the inter-bar overlaps the touch sensor pad in a depth dimension of the display device, and wherein the inter-bar includes the insulator without the conductive balls in a region in which the inter-bar does not overlap the touch sensor pad in the depth dimension of the display device.

20. The display device of claim 17, wherein the conductive member extends in a lengthwise direction of the touch sensor pad.

21. The display device of claim 20, wherein the conductive member has a length greater than a length of the touch sensor pad in the lengthwise direction.

22. The display device of claim 21, wherein the conductive member has opposing end portions that do not overlap the touch sensor pad in a depth dimension of the display device.

23. The display device of claim 4, wherein the second substrate further comprises a driving pad configured to transmit an image signal to the display area, and wherein the inter-bar is provided between the display area and the driving pad.

24. The display device of claim 23, wherein the first substrate does not overlap the driving pad.

25. The display device of claim 1, wherein a sidewall of the interlayer is exposed to the outside on at least one of second to fourth sides of the first substrate.

26. The display device of claim 1, wherein the touch sensor comprises:
a plurality of sensing electrodes; and
a plurality of wiring lines electrically connecting the sensing electrodes to the touch sensor pad.

27. The display device of claim 26, wherein the sensing electrodes include a plurality of first electrodes and a plurality of second electrodes crossing each other, and wherein the touch sensor pad includes a first touch sensor pad connected to the first electrodes and a second touch sensor pad connected to the second electrodes.

28. The display device of claim 27, wherein the connecting pad includes a first connecting pad corresponding to the first touch sensor pad, and a second connecting pad corresponding to the second touch sensor mad.

29. The display device of claim 1, wherein the inter-bar includes a plurality of spacers and a binder including the spacers.

30. The display device of claim 29, wherein each of the spacers has a spherical shape.

31. The display device of claim 30, wherein a diameter of the spacers has a height less than or equal to that of the inter-bar.

32. A manufacturing method of a display device including a display area and a non-display area, the manufacturing method comprising:
- forming a first substrate including a touch sensor in the display area and a touch sensor pad in the non-display area;
- forming a second substrate including a pixel and a connecting pad in the non-display area;
- pre-cutting a portion of the first substrate along a cutting line;
- forming an interlayer over the display area and the non-display area of the first substrate or over the display area and the non-display area of the second substrate;
- forming a conductive member in the connecting pad or in the touch sensor pad;
- forming an inter-bar in at least the non-display area of the first substrate or the second substrate adjacent to the cutting line, the inter-bar being on one side of the interlayer adjacent to the cutting line;
- attaching the first substrate to the second substrate; and
- removing the pre-cut portion of the first substrate.

33. The manufacturing method of claim 32, wherein the cutting line is provided in the non-display area, and wherein the cutting line is bent toward the display area.

34. The manufacturing method of claim 32, wherein the forming of the interlayer comprises:
- applying an interlayer material to at least one of the display area of the first substrate and the display area of the second substrate;
- pre-curing the interlayer material; and
- curing the interlayer material.

35. The manufacturing method of claim 34, wherein the conductive member and the inter-bar are cured with the interlayer material.

36. The manufacturing method of claim 32, wherein the inter-bar is provided between the touch sensor pad and a first side of the first substrate.

37. The manufacturing method of claim 32, wherein the conductive member is integrally formed with at least a portion of the inter-bar in an inseparable body.

38. The manufacturing method of claim 37, wherein at least the portion of the inter-bar includes a plurality of conductive balls and an insulator, wherein the portion of the inter-bar overlaps the touch sensor pad in a depth dimension of the display device.

39. The manufacturing method of claim 38, further comprising depositing the conductive member through a nozzle that is configured to move along an imaginary line, wherein the depositing includes starting discharging at a starting point and stopping discharging at an end point.

40. The manufacturing method of claim 38, wherein a starting point and an end point do not overlap the touch sensor pad in the depth dimension of the display device.

41. The manufacturing method of claim 32, further comprising:
- providing a first carrier substrate supporting the first substrate to a backside of the first substrate; and
- providing a second carrier substrate supporting the second substrate on a backside of the second substrate.

42. The manufacturing method of claim 41, further comprising respectively removing the first and second carrier substrates from the first and second substrates.

43. The manufacturing method of claim 42, wherein the pre-cut portion of the first substrate is removed together with the first carrier substrate when removing the first carrier substrate.

44. A manufacturing method of a display device including a display area and a non-display area, the manufacturing method comprising:
- providing a first mother substrate including a plurality of first unit regions, each first unit region including a touch sensor and a touch sensor pad;
- providing a second mother substrate including a plurality of second unit regions corresponding to the first unit regions, each second unit region including a pixel and a connecting pad;
- pre-cutting a portion of the first unit region of the first mother substrate along a cutting line;
- forming an interlayer over the display area of the first mother substrate and the second mother substrate;
- forming a conductive member over the connecting pad or the touch sensor pad;
- forming an inter-bar over the non-display area of the first mother substrate and the second mother substrate corresponding to the cutting line;
- coupling the first mother substrate to the second mother substrate;
- removing a pre-cut portion of the first mother substrate; and
- cutting the first and second mother substrates coupled along a boundary of the first and second unit regions.

45. The manufacturing method of claim 44, wherein the cutting line extends between two first unit regions that are adjacent to each other.

46. The manufacturing method of claim 44, further comprising depositing the conductive member through a nozzle that moves along an imaginary line, wherein the depositing includes starting discharging at a starting point and stopping discharging at an end point.

47. The manufacturing method of claim 46, wherein the starting point and the end point do not overlap the touch sensor pad in a depth dimension of a display device.

48. The manufacturing method of claim 47, wherein the imaginary line extends between the first unit regions that are adjacent to one another.

* * * * *